United States Patent [19]
Nitta et al.

[11] Patent Number: 5,831,924
[45] Date of Patent: Nov. 3, 1998

[54] SYNCHRONOUS SEMICONDUCTOR MEMORY DEVICE HAVING A PLURALITY OF BANKS DISTRIBUTED IN A PLURALITY OF MEMORY ARRAYS

[75] Inventors: Yasuhiko Nitta; Masaki Tsukude, both of Hyogo, Japan

[73] Assignee: Mitsubishi Denki Kabushiki Kaisha, Tokyo, Japan

[21] Appl. No.: 711,331

[22] Filed: Sep. 6, 1996

[30] Foreign Application Priority Data

Sep. 7, 1995 [JP] Japan ..................................... 7-230250

[51] Int. Cl.$^6$ ....................................................... G11C 8/00
[52] U.S. Cl. ................ 365/230.03; 365/233; 365/230.02
[58] Field of Search ......................... 365/230.03, 230.02, 365/189.01, 230.06, 233

[56] References Cited

U.S. PATENT DOCUMENTS 5,404,338  4/1995  Murai et al. ............................ 365/233
5,553,026  9/1996  Nakai et al. ......................... 365/230.03

FOREIGN PATENT DOCUMENTS 266273  12/1994  Taiwan .

OTHER PUBLICATIONS

"Semiconductor Memories", 2nd edition, Betty Prince (1991), pp. 170–171, 472–473.

Primary Examiner—David C. Nelms
Assistant Examiner—Haoi V. Ho
Attorney, Agent, or Firm—McDermott, Will & Emery

[57] ABSTRACT

One memory array is divided into a plurality of banks sharing a row of memory cells. Global IO buses are disposed for memory column blocks forming the plurality of banks included in one memory array. The global IO buses are selectively and electrically connected to the same data input/output terminal.

15 Claims, 27 Drawing Sheets

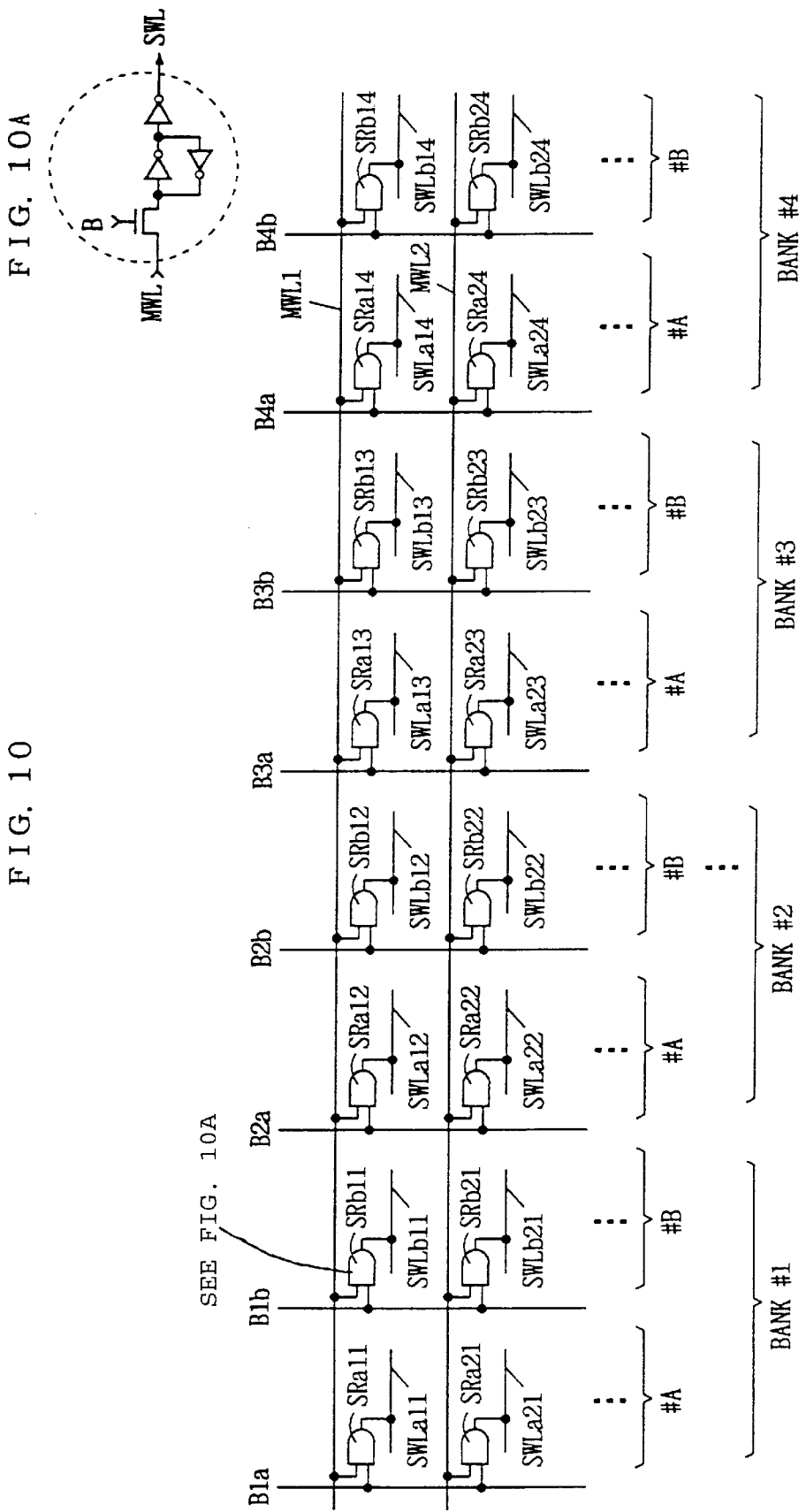

BSja,BSjb : PRODUCED FROM THE MEMORY SEGMENT
DESIGNATION SIGNAL AND THE ROW BANK ADDRESS
(Bja,Bjb)

F I G. 1 7 PRIOR ART

SYNCHRONOUS SEMICONDUCTOR MEMORY DEVICE HAVING A PLURALITY OF BANKS DISTRIBUTED IN A PLURALITY OF MEMORY ARRAYS

BACKGROUND OF THE INVENTION

1. Field of the Invention

The present invention relates to synchronous semiconductor memory devices operating in synchronism with an external clock signal and, more particularly, to a configuration of a memory cell array portion of a synchronous semiconductor memory device of a multi-bank and multi-DQ arrangement having a plurality of banks and inputting/outputting a multi-bit data.

2. Description of the Background Art

Microprocessors have increasingly higher functions these days. Especially, increase in speed of a clock signal which determines the operation speed of a microprocessor and expansion in address space which determines the capacity of data to be processed are conspicuous. Microprocessors with a clock frequency of 100–300 MHz and 32 to 64 address bits (address space of $2^{32}$–$2^{64}$ addresses) are commercially available in the market. However, there is no memory device for storing data and instructions which can satisfy both increase in speed of a clock signal and expansion in address space. If a system employing a high level function microprocessor is to be constructed, there is no choice but to use an SRAM (Static Random Access Memory) for higher speed and a DRAM (Dynamic Random Access Memory) for a greater storage capacity to store a large amount of data/instructions.

In order to cope with such higher level functions of microprocessors (MPUs or CPUs), various types of large storage capacity DRAMs allowing high speed access are developed, such as "a synchronous DRAM (SDRAM)", "a cache DRAM (CDRAM)", and "a Rambus DRAM (RDRAM)". A cache DRAM includes an SRAM as a cache and a DRAM as a main memory integrated on one chip, and achieves high speed access and large storage capacity by transferring data between the SRAM and the DRAM. A Rambus DRAM utilizes a DRAM as a portion to store data, and includes an interface logic circuit at a core portion of the DRAM for communicating data with a microprocessor (MPU or CPU). The interface logic circuit includes an input/output interface circuit for data input/output, a clock circuit for generating a control signal for operation control, and a protocol control circuit for controlling the protocol used for data input/output. Data can be transferred at a high speed by inputting/outputting data through this interface logic circuit.

An SDRAM achieves high speed access by carrying out input/output of data and input of the control signals in synchronism with the clock signal. An SDRAM requires neither protocol control for data transfer as used in an RDRAM nor use of an SRAM as in a CDRAM, and simply requires a configuration for inputting/outputting data in synchronism with the clock signal additionally in a conventional DRAM. Therefore, it has an advantage of requiring only a very few design changes made to a conventional DRAM, and thus it is a promising device.

In order to clarify how an SDRAM corresponds to a normal DRAM, a brief description will now be made of configuration and operation of a conventional standard DRAM.

FIG. 17 schematically shows an arrangement of an array portion of a conventional standard DRAM. In FIG. 17, a configuration of a memory array 1 is shown in which memory cells of 4M bits are arranged in a matrix of 4K rows and 1K column. Memory array 1 includes 16 memory segments 4-1 to 4-16, each having memory cells arranged in 256 rows and 1024 columns. In each of memory segments 4-1 to 4-16, a word line WL is arranged corresponding to each row of the memory cells, and a column selection line CSL is arranged corresponding to each column of the memory cells. Column selection line CSL is disposed common to 16 memory segments 4-1 to 4-16.

Memory array 1 includes, for selection of an addressed memory cell, a row decoder 2a for decoding a row address signal applied through a path not shown and generating a word line selection signal for selecting a word line to which the addressed memory cell is connected, a word line driver 2b responding to the word line selection signal from row decoder 2a for driving the addressed word line to the selected state, and a column decoder 3 for decoding a column address signal applied through a path not shown and driving column selection line CSL arranged corresponding to the addressed column to the selected state.

Furthermore, global IO buses G1–G16 corresponding to respective memory segments 4-1 to 4-16 are arranged in parallel to column selection line CSL. Global IO buses G1–G16 communicate data with the selected memory cell in the corresponding memory segments 4-1 to 4-16. These global IO buses G1–G16 are coupled to a data read/write circuit which is not shown.

FIG. 18 schematically shows a configuration of the memory segment shown in FIG. 17. In FIG. 18, one memory segment 4 (4-1 to 4-16) is shown representatively. Referring to FIG. 18, memory segment 4 includes two memory cell portions 6a and 6b in which memory cells MC are arranged in a matrix, and a sense amplifier band 5 located between memory cell portions 6a and 6b.

Memory cell portion 6a includes word lines WL1a, WL2a, ..., arranged corresponding to each row of memory cells MC and connected to memory cells MC in the corresponding rows, and bit line pairs BL1a, /BL1a to BL1024a, /BL1024a arranged corresponding to respective columns of memory cells MC. Bit lines BLia, /BLia (i=1 to 1024) are arranged in pair, each receiving complementary data signals. In memory cell portion 6a, 128 word lines WL are disposed. Memory cell MC is arranged corresponding to a crossing of word line WL (WL1a–WL128a) and bit line pair BLia, /BLia. Memory cell MC includes a capacitor C for storing information in the form of electric charges, and an access transistor T for connecting memory capacitor C to the corresponding bit line BLia (or /BLia) in response to the signal potential on the corresponding word line.

Similarly to memory cell portion 6a, memory cell portion 6b includes word lines WL1b–WL128b arranged corresponding to each row of the memory cells, and bit line pairs BL1b, /BL1b to BL1024b, /BL1024b arranged corresponding to each column of memory cells MC.

Sense amplifier band 5 includes sense IO circuits SI1–SI1024 arranged corresponding to each column (bit line pair) of memory cell portions 6a and 6b, and local IO lines LIOS, /LIOS arranged in common to memory cell columns in a row direction.

In order to transfer a column selection signal from the column decoder (see FIG. 17), column selection lines CSL1, CSL2, ..., are disposed in parallel to each column of memory segment 4.

Sense IO circuit SIi includes a sense amplifier SA for differentially amplifying the signal potential on the corresponding bit line pair BLia, /BLia (or BLib, /BLib), and transmission gates 8 and 9 responsive to the signal potential on column selection line CSLi for connecting a sensing node of sense amplifier SA (the selected bit line pair) to local IO lines LIOS, /LIOS.

For each of bit line pairs BL1a, /BL1a to BL1024a, /BL1024a and BL1b, /BL1b to BL1024b, /BL1024b, a bit line isolation gate is arranged which is rendered conductive in response to a memory cell portion selection signal. These bit line pair isolation gates are not shown for the sake of simplicity in the figure. The bit line pair of a memory cell portion including a selected memory cell is connected to the sense IO circuit, while the bit line pair in the other non-selected memory cell portion is isolated from the sense IO circuit. In the standby state, bit line pairs BL1a, /BL1a to BL1024b, /BL1024b in memory cell portions 6a and 6b are connected to the corresponding sense IO circuits SI1–SI1024.

A segment selection gate SSG rendered conductive in response to a memory segment selection signal is provided for local IO lines LIOS, /LIOS and the corresponding global IO lines GIO, /GIO. Segment selection gate SSG includes transmission gates 10 and 11 which are rendered conductive in response to the memory segment selection signal MSS and connect local IO lines LIOS and /LIOS to global IO lines GIO, /GIO. A brief description will now be made of operation with reference to FIGS. 19A and 19B illustrating the operation waveforms.

Referring to FIG. 19A, operation upon data readout will be described. A memory access cycle is determined by a row address strobe signal /RAS. When signal /RAS is at a high level in an inactive state, memory array 1 attains a precharge state and all the bit line pairs BL, /BL (representatively indicating the bit lines) in memory segments 4-1 to 4-16 are precharged to an intermediated potential. Word line WL (representatively indicating the word line) is all at a low level in a non-selected state. Local IO lines LIOS, /LIOS and global IO lines GIO, /GIO are all precharged, to a prescribed precharge potential. FIG. 19A shows local IO lines LIOS, /LIOS and global IO lines GIO, /GIO precharged to the intermediated potential.

When row address strobe signal /RAS is activated at a low level, operation of selecting a memory cell in memory array 1 is initiated. In synchronism with a fall of signal /RAS, an applied address signal is taken in as a row address signal X and then decoded by row decoder 2a shown in FIG. 17, a word line selection signal is generated, and the selected word line is driven to the selected state by word line driver 2b. For simplicity of description, the following description is made based on an assumption that a memory cell of 1 bit is selected in memory array 1. In this case, only one memory segment attains a selected state and the remaining 15 memory segments maintain a standby state. Assuming that memory segment 4 shown in FIG. 18 is in the selected state, only the memory cell portion including the selected word line is connected to sense IO circuits SI1–SI1024.

It is assumed that word line WL1a attains the selected state. Then, bit line pairs BL1a, /BL1a to BL1024a, /BL1024a in memory cell portion 6a are connected to sense IO circuits SI1–SI1024, while bit line pairs BL1b, /BL1b to BL1024b, /BL1024b in memory cell portion 6b are disconnected from sense IO circuits SI1–SI1024. When the selected word line WL (WL1a) is driven to the selected state by word line driver 2b shown in FIG. 17 and the potential thereof rises to a high level, storage data of memory cells MC connected to selected word line WL1a are read out to the corresponding bit lines BL1a–BL1024a. Since no selected memory cells are connected to the other bit lines /BL1a–/BL1024a, they maintain a precharge potential. Next, sense amplifier SA attains an active state, and memory cell data on bit line pairs BL1a, /BL1a to BL1024a, /BL1024a are detected, amplified and latched.

Subsequently, in accordance with a column address strobe signal /CAS which has attained an active state by this point in time, the address signal applied at this point is taken in as a column address signal Y, and a column is selected by column decoder 3 (see FIG. 17). After the signal potentials of bit line pairs BL1a, /BL1a to BL1024a, /BL1024a are sensed and amplified, a column selection signal from column decoder 3 attains an active state and one column selection line attains an active state. It is assumed that column selection line CLS1 is selected. Then, in accordance with the column selection signal on column selection line CSL1, transmission gates 8 and 9 included in sense IO circuit SI1 are rendered conductive, bit lines BL1a, /BL1a are connected to local IO lines LIOS, /LIOS, and data on bit lines BL1a and /BL1a (data sensed and amplified by sense amplifier SA) are transmitted.

Subsequently, memory segment selection signal MSS attains an active state and transmission gates 10 and 11 included in segment selection gate SSG are rendered conductive, whereby local IO lines LIOS and /LIOS are connected to the corresponding global IO lines GIO, /GIO and data on local IO lines LIOS and /LIOS are transmitted to global IO lines GIO, /GIO.

It should be noted that memory segment selection signal MSS is formed from the address signal used for connecting the sense IO circuit and the memory cell portion (for example., most significant 4s of row address signal X). Thereafter, readout data Q is output through a read out circuit (not shown). After one memory cycle is completed, signal /RAS attains an inactive state at a high level and column address strobe signal /CAS also attains an inactive state at a high level, whereby memory array 1 returns to the precharge state.

Referring to FIG. 19B, operation in writing data will now be described. Upon writing of data, same operations those in data readout are carried out up to selection of word line WL, activation of the sense amplifier, and sensing, amplification and latch of data of the selected memory cell.

Upon writing of data, internal write data is transmitted on global IO lines GIO and /GIO by a write driver (not shown) in accordance with write data D. The transmission timing of the internal write data is determined by activation of column address strobe signal /CAS and a write enable signal /WE (not shown), whichever is later. In FIG. 19B, the data write timing is shown being determined by column address strobe signal /CAS. When column address strobe signal /CAS attains an active state at a low level, column decoder 3 transmits a column selection signal to column selection line CSL arranged corresponding to the selected column in accordance with column address signal Y. At this time, transmission gates 8 and 9 are rendered conductive in response to the column selection signal and, at the same time, transmission gates 10 and 11 included in segment selection gate SSG are rendered conductive. As a result, global IO lines GIO, /GIO are electrically connected through local IO lines LIOS, /LIOS to bit lines BL, /BL (assumed here as BL1a, /BL1a) arranged corresponding to the selected column. The write data is transmitted onto global IO lines GIO, /GIO by a write driver with a great driving ability, and the data latched at sense amplifier SA corresponds to the write data applied from global IO lines GIO, /GIO through local IO lines LIOS, /LIOS. Consequently, the write data is written to the selected memory cell. FIG. 19B shows an example in which data latched by the sense amplifier of the selected bit lines BL, /BL is inverted by the internal write data applied through global IO lines GIO, /GIO.

After writing of data is completed, row address strobe signal /RAS and column address strobe signal /CAS both attain an inactive state at a high level, and memory array 1 goes back to the precharge state. Through such operations as described above, read/write of data can be carried out from/to the memory cell of 1 bit on memory array 1.

FIG. 20 schematically shows an arrangement of arrays in a DRAM of 16M bits. Referring to FIG. 20, a DRAM 10 includes four memory arrays 1a–1d, each having a storage capacity of 4M bits. Memory arrays 1a–1d each have a configuration same as those shown in FIGS. 17 and 18. Memory arrays 1a–1d each are provided with word line drivers 2ba–2bd and column decoders 3a–3d. Word line drivers 2ba–2bd and column decoders 3a–3d drive the word line and the column selection line in the corresponding memory arrays 1a–1d to the selected state.

It is assumed that DRAM 10 has x4 configuration for input/output of 4-bit data and has a 4K refresh cycle. A 4K refresh cycle means that all the memory cells included in DRAM 10 are refreshed once by performing the refresh 4K times. In a multi-bit DRAM for inputting/outputting multi-bit data (a DRAM of multi-DQ), the number of word lines driven to the selected state in one access (addressing) is determined by the refresh cycle. If the DRAM of 16M bits shown in FIG. 20 has a 4K refresh cycle, the total number of word lines included therein is 4K·4, and therefore four word lines must be driven to the selected state simultaneously. Usually, one word line WL is selected in each of the four memory arrays 1a–1d as shown in FIG. 21, and the four word lines are simultaneously driven to the selected state. Input/output of 4-bit data can be achieved by selecting and accessing a memory cell of 1 bit for the selected word line WL in each of memory arrays 1a–1d.

As shown in FIG. 20, word line drivers 2ba–2bd and column decoders 3a–3d are provided for respective memory arrays 1a–1d. Row decoder 2a is provided for each of word line drivers 2ba–2bd as shown in FIG. 17. Therefore, memory arrays 1a–1d can be driven independently from each other if the row decoder and the column decoder in each of memory arrays 1a–1d are driven independently from those of the other memory arrays. More specifically, when one memory array of memory arrays 1a–1d attains the selected state and a memory cell therein is selected, the remaining memory arrays maintain the precharge state; and when one memory array is selected, another memory array can be driven from the precharge state to the selected state. An SDRAM has this function of operating memory arrays 1a–1d independently from each other.

FIG. 22 is a timing chart illustrating operation of an SDRAM upon data readout. Readout operation of an SDRAM will be briefly described below.

In an SDRAM, an external control signal is taken in and the decided data is input/output in synchronism with an externally applied clock signal CLK such as a system clock. FIG. 22 shows an example of data readout operation in which CAS latency, indicating the number of clock cycles required for output of valid data after column address strobe signal /CAS attains an active state, is 1, and the burst length indicating the number of data bits (for one DQ terminal) continuously read out in one addressing is 4.

In SDRAM, external control signals, i.e. row address strobe signal /RAS, column address strobe signal /CAS and write enable signal /WE, are applied in the form of one shot pulse. Operation performed on the SDRAM is determined by the states of these external control signals at the rise of clock signal CLK.

In clock cycle 1, row address strobe signal /RAS is at a low level in an active state at the rise of clock signal CLK. In this state, access to the SDRAM is designated, an address signal Add applied at this time is incorporated as a row address signal X0, and a bank is designated and accessed by a bank address signal BA applied at the same time. FIG. 22 shows a state where a bank A is designated. In this state, row selection operation in accordance with row address signal X0 is performed on bank A (any of memory arrays 1a–1d shown in FIG. 21).

In clock cycle 2, column address strobe signal /CAS is at a low level and write enable signal /WE is maintained at a high level at the rise of clock signal CLK, thereby designating column selection operation and data readout operation. By this activation of signal /CAS, address signal Add applied at this point in time is incorporated as a column address signal Y0 and bank address BA designating bank A is incorporated. As a result, data of the memory cell in the column designated by column address signal Y0 is selected. Since CAS latency is 1, data A1–A4 at four addresses, starting from the data of the memory cell designated by address signals X0 and Y0, are sequentially output from the next clock cycle 3 in synchronism with the rise of clock signal CLK.

In clock cycle 5, at the rise of clock signal CLK, both signals /RAS and /WE attain a low level, designating precharge of bank A. However, since CAS latency is 1, memory cell data A4 previously read out is read out in the next clock cycle 6 even though the precharge operation is performed. In clock cycle 6, signal /RAS attains an active state at a low level, and bank address BA designates another bank B. In bank B, row selection operation is carried out in accordance with a row address signal X1 incorporated at this point in time.

In clock cycle 7, at the rise of clock signal CLK, signal /CAS is at a low level and signal /WE is at a high level, and data readout for bank B is designated. A column of the memory cells is designated again in accordance with a column address signal Y1 incorporated at this point in time, data B1 of the memory cell first designated by address signals X1 and Y1 is output at the rise of clock signal CLK, and then the next data B2 of the memory cell is read out in clock cycle 9.

In SDRAM, memory cells in accordance with a burst length are selected simultaneously in one addressing and data of the memory cells selected simultaneously are sequentially read out in synchronism with clock signal CLK.

FIG. 23 is a timing chart illustrating operation upon writing of data. FIG. 23 relates to data writing operation where the burst length is 4 and CAS latency is 1 as is the case in FIG. 22. In clock cycle 1, at the rise of clock signal CLK, signal /RAS is at a low level in an active state and memory access is designated. In accordance with address signals Add and BA applied at this point in time, the row of bank A designated by row address signal X0 attains the selected state. In clock cycle 2, signals /CAS and /WE are at a low level in an active state, designating writing of data. In this case, address signal Add is taken in as column address signal Y0 and the column designated by column address signal Y0 in bank A designated by bank address BA is selected.

Simultaneously therewith, write data A1 externally applied is taken in. The write data applied externally is simply taken in and not written in the memory cell. Starting from clock cycle 2, write data A2–A4 are sequentially applied externally. These data A1–A4 are written to the memory cells at four addresses starting from the address specified by address signals X0 and Y0. Several manners of such data writing are possible: four data A1–A4 can be written simultaneously or written sequentially to the memory cells from clock cycle 3, or two data can be written to the memory cells at a time.

In clock cycle 5, signal /RAS is at a low level, and access to bank B is designated in accordance with bank address BA. In accordance with address signal Add applied at this point in time, row address signal X1 is taken in and row selection operation is performed on bank B. Since CAS latency is 1, data A4 remaining at this point in time is written to the corresponding memory cell in bank A in the next clock cycle 6. In cycle 6, signals /CAS and /WE are both at a low level, designating writing of data to bank B. In accordance with column address signal Y1, a corresponding column in bank B is selected. Write data B1–B4 sequentially applied from clock cycle 6 are written sequentially or simultaneously to four memory cells starting from the memory cell designated by addresses X1 and Y1. In clock cycle 7, signals /RAS and /WE are both at a low level, and bank address BA is set at a state designating bank A, whereby precharge operation is performed on bank A.

As described above, each bank can attain an active state and a precharge state independently from each other in the bank configuration. This can be achieved because a column decoder and a row decoder are provided for each of memory arrays 1a to 1d as shown in FIGS. 20 and 21 described above.

However, this SDRAM gives rise to the following problems if the word line selection method shown in FIG. 21 is employed. More specifically, in a DRAM with x4 configuration, data is input/output to/from a memory cell of 1 bit in each of memory arrays 1a–1d. With the 4 bank configuration, only one of memory arrays 1a–1d attains an active state (a word line is selected and data is input/output to/from the memory cell connected to the selected word line). In this case, therefore, simply data of 1 bit is input/output. As described above, with an SDRAM, there is a concept of the burst length and memory cells corresponding in number to the burst length must be selected simultaneously. Therefore, in a normal SDRAM, local IO lines and global IO lines must be increased in number and the selected columns (bit line pairs) must also be increased in number in each of memory arrays 1a–1d in accordance with the number of banks. For example, if the burst length is 4 and 4-bit data is input/output with 4 banks provided, memory cells of 16 bits are selected at the same time in each of memory arrays 1a–1d, so that data must be input/output through 16 pairs of local IO lines and 16 pairs of global IO lines. If 2 banks are provided, memory cells of 8 bits must be selected simultaneously in one memory array.

FIG. 24 shows, as an example, a configuration of one memory array when the burst length is 4 and 4-bit data is input/output. Global IO line pairs G1–G16 are disposed common to memory cells 4-1 to 4-16. Since arrangement of 16 pairs of global IO lines in each memory segment leads to an increase in area occupied by interconnections, the global IO lines are disposed common to memory segments 4-1 to 4-16 to seek reduction in area occupied by the interconnections. Memory cells MC of 16 bits are selected simultaneously in one memory segment (for example, 4-1), communicating data with 16 global IO line pairs G1–G16 (the local IO line pair is shown schematically by the bidirectional arrow). Global IO line pairs G1–G16 are coupled to a read/write circuit 15 for reading/writing data in synchronization with clock signal CLK. From read/write circuit 15, 4-bit data is input/output through input/output terminals DQ0-DQ3. Thus, with such a configuration, 4-bit data can be input/output with the burst length of 4 in the 4 bank configuration by utilizing the array configuration of a standard DRAM.

FIG. 25 schematically shows how memory arrays of a standard DRAM correspond to data input/output terminals. Referring to FIG. 25, data input/output (DQ) pad terminals DQ1-DQ4 are disposed for four memory arrays 1a–1d, respectively. These pads DQ1–DQ4 are disposed at the central portion of memory arrays 1a–1d and have a so-called lead on chip (LOC) arrangement, connecting to external pin terminals through a frame lead, which is not shown. Similarly to the configuration shown in FIGS. 20 and 21 described above, word line drivers 2ba–2bd and column decoders 3a–3d are provided for memory arrays 1a–1d, respectively.

In the standard DRAM 10, when 4-bit data is input/output, memory arrays 1a–1d correspond uniquely to DQ pads (input/output data terminals) DQ1–DQ4, respectively, in a one-to-one correspondence relationship. More specifically, memory arrays 1a–1d are connected to DQ pads DQ1–DQ4 through interconnections 20a–20d, respectively. Interconnections 20a–20b are shown as connected from column decoders 3a–3d, respectively. Interconnections 20a–20d are connected to column decoders 3a–3d to simply illustrate how memory arrays 1a–1d correspond to DQ pads DQ1–DQ4, and interconnections are disposed from memory arrays 1a–1d through the read/write circuit to DQ pads DQ1–DQ4.

As illustrated in FIG. 25, in standard DRAM 10, memory arrays 1a–1d correspond to DQ pads DQ1–DQ4 in a one-to-one correspondence relationship and interconnection lines 20a–20d are disposed from memory arrays 1a–1d to the corresponding DQ pads DQ1–DQ4. Therefore, interconnection lines need only be disposed from memory arrays 1a–1b to the proximate DQ pads, allowing efficient arrangement of the interconnections.

Meanwhile, the bank configuration is employed for an SDRAM. In this case, 4-bit data is input/output from each bank. FIG. 26 shows arrangement of interconnections between memory arrays 1a–1d and DQ pads DQ1–DQ4 when four banks are provided. Similarly to the standard DRAM, word line drivers 2ba–2bd and column decoders 3a–3d are provided for respective memory arrays 1a–1d. With the 4-bank configuration, memory arrays 1a–1d attain the selected state (an active state) independently from each other. More specifically, when one memory array 1a is selected, 4-bit data is input/output to memory array 1a. The same applies to the remaining memory arrays 1b–1d. Thus, each of memory arrays 1a–1d is required to input/output data in parallel (simultaneously) to/from DQ pads DQ1–DQ4. As a result, as shown in FIG. 26, interconnections 20 for data input/output between memory arrays 1a–1d and DQ pads DQ1–DQ4 are intricate and therefore interconnection layout is complex, leading to an undesirable increase in area occupied by the interconnections.

Especially, if the number of input/output data bits in an SDRAM increases to, for example, 16 bits and 32 bits, this problem of complicated interconnections is more prominent. In addition, even if interconnections are disposed, many data input/output interconnection lines are connected to one DQ pad DQ, thereby increasing load capacitance associated with the DQ pad and accordingly giving rise to a problem that fast data input/output is impaired.

In order to solve such a problem of intricate interconnections between the memory arrays and the DQ pads, one may think of a method of disposing IO buses 25a and 25b for DQ pads DQ1–DQ4 as illustrated in FIG. 27. Memory arrays 1a and 1c communicate data with 4-bit IO bus 25a, while memory arrays 1b and 1d communicate data with IO bus 25b. Each of IO buses 25a and 25b is a 4-bit bus, each bit connected correspondingly to DQ pads DQ1–DQ4. Such arrangement of the buses can solve the problem shown in FIG. 26 of the complicated interconnections. With use of such IO buses, however, the following problems still remain.

More specifically, data of 4 bits is input/output between memory arrays 1a–1d and IO buses 25a and 25b. Consequently, the number of interconnection lines for data input/output to/from each memory array is increased and therefore the area occupied by the interconnections is increased as compared to the standard DRAM shown in FIG. 25. Similarly, IO buses 25a and 25b each have 4-bit width, leading to an increase in area occupied by these bus interconnections. In addition, a bus drive circuit for driving IO bus 25a or 25b is required in each of memory arrays 1a–1d. Since such drive circuit is required for 4 bits, the area occupied by the circuit is increased. Furthermore, IO buses 25a and 25b are disposed over a plurality of memory arrays, whereby the interconnection length of the bus and therefore load capacitance are increased and signal propagation delay is generated due to parasitic capacitance and resistance of the signal interconnection lines, preventing data transfer at a high speed.

Generally, when LOC configuration is employed for pad arrangement, a peripheral control circuit 30 is disposed at the central portion of the chip as shown in FIG. 28. In FIG. 28, peripheral control circuit 30 is disposed at the central portion between memory mats 11a and 11b and memory mats 11c and 11d. Each of memory mats 11a–11d includes a memory array, a word line driver, and a column decoder and a row decoder. Peripheral control circuit 30 receives an external control signal and transmits the control signal and an address signal to each of memory mats 11a–11d. Peripheral control circuit 30 is disposed between DQ pads DQ1 and DQ2 and DQ pads DQ3 and DQ4. In this case, with the IO bus arrangement as shown in FIG. 27, the IO bus is disposed over peripheral control circuit 30, whereby disposition of the IO bus becomes extremely difficult. As a result, the IO bus must be formed by employing interconnections at an interconnection layer different from that for peripheral control circuit 30, or the IO bus must be disposed through an empty region formed at peripheral control circuits 30. Consequently, the degree of freedom in layout of peripheral control circuit 30 is decreased and greater constraints are imposed on the arrangement of the IO bus, whereby efficient arrangement of the bus cannot be achieved.

SUMMARY OF THE INVENTION

An object of the present invention is to provide a synchronous semiconductor memory device that allows simple arrangement of interconnections between memory mats and data input/output pads in a bank configuration without an increase in area.

Another object of the present invention is to provide an SDRAM that allows simple arrangement of interconnections between memory mats and data input/output pads regardless of the number of banks.

Briefly speaking, in a synchronous semiconductor memory device according to the present invention, each of a plurality of memory arrays is divided into banks corresponding uniquely to data input/output pads in a one-to-one correspondence relationship.

More specifically, a synchronous semiconductor memory device according to a first aspect of the present invention includes a data terminal for at least one of input and output of external data, and one memory array provided corresponding to the data terminal. The memory array includes a plurality of memory cells arranged in a matrix and the selected memory cell communicates data with the data terminal. The memory array is divided into a plurality of banks driven independently from each other, arranged adjacent to each other and aligned with respect to the rows of the memory cells.

A synchronous semiconductor memory device according to a second aspect of the present invention includes a plurality of data terminals for input or output of multi-bit data, and a plurality of memory arrays provided corresponding to each of the plurality of data terminals. Each of the plurality of memory arrays has a plurality of memory cells arranged in a matrix and the selected memory cell in the memory array communicates data with the corresponding data terminal. Each of the plurality of memory arrays is further divided into a plurality of banks driven independently from each other.

By thus dividing the memory array provided corresponding to the data terminal into a plurality of banks, the bank communicates data with the data terminal corresponding to the memory array in each memory array. Therefore, connections between the memory arrays and the data terminals can always be determined uniquely even if the number of banks provided is chosen as desired. Since the designated bank is activated in each memory array, the memory cell selected in the bank can communicate data with the outside through the data terminal provided corresponding to the associated memory array. As a result, interconnections between the memory arrays and the data terminals can always be determined uniquely regardless of the number of banks provided, thereby simplifying arrangement of the interconnections.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3 and 3A are a diagram showing an arrangement of word lines shown in FIG. 2.

FIGS. 10 and 10A are a diagram schematically showing a configuration of a main part of a semiconductor device according to a second embodiment of the present invention.

DESCRIPTION OF THE PREFERRED EMBODIMENTS

Embodiment 1

Figure 1:
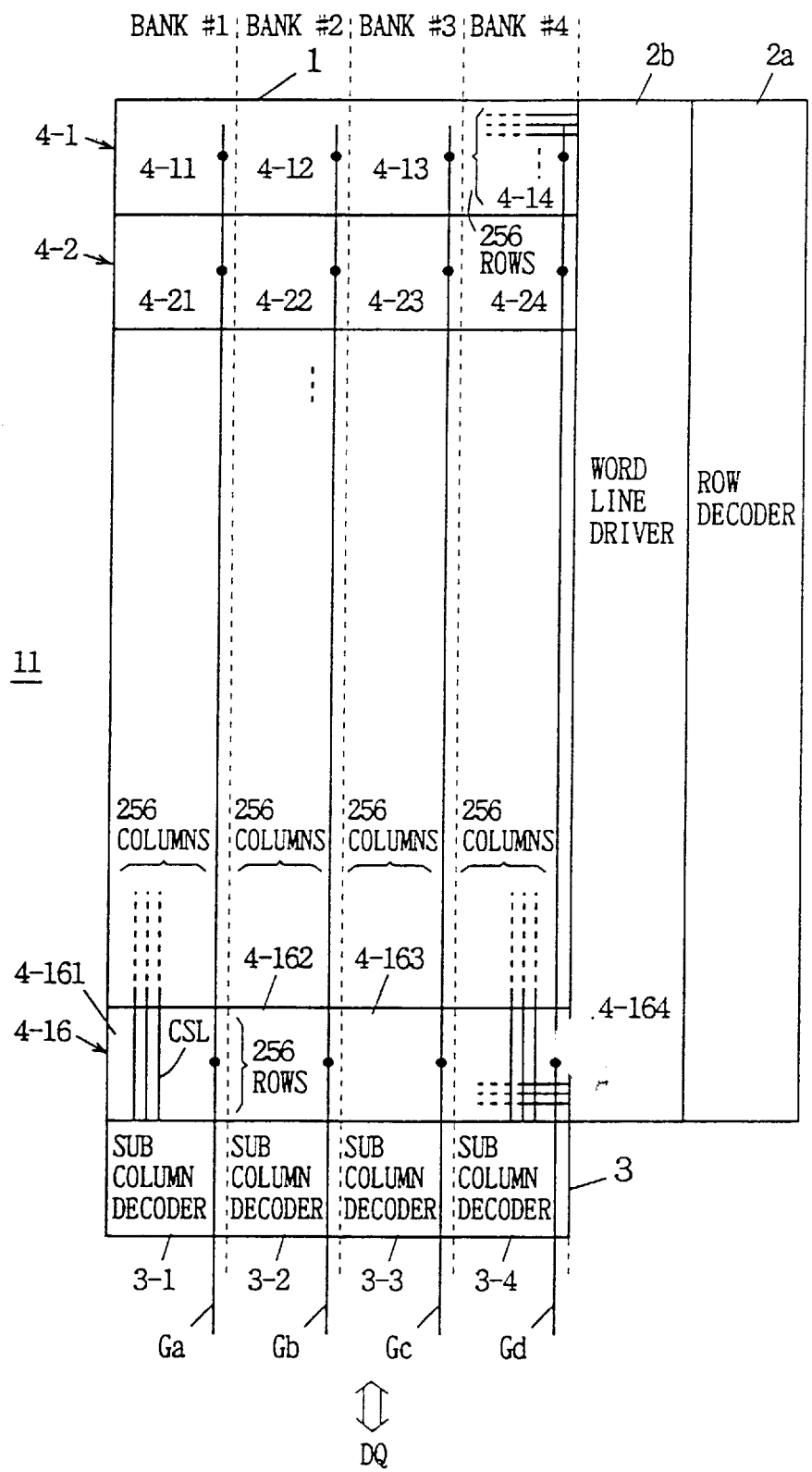
FIG. 1 is a diagram schematically showing a configuration of a main part of a semiconductor device according to a first embodiment of the present invention.

FIG. 1 is a diagram schematically showing a configuration of a main part of a synchronous semiconductor memory device according to a first embodiment of the present invention. Referring to FIG. 1, a configuration of one memory mat 11 is schematically shown. In FIG. 1, memory array 1 includes memory cells arranged in 4K rows and 1K column, as an example (memory cells are not shown in FIG. 1). Memory array 1 is divided into 16 memory segments 4-1 to 4-16 in the column direction, each having memory cells disposed in 256 rows. Each of memory segments 4-1 to 4-16 is further divided into four array blocks or sub arrays in the direction along which rows of memory cells extend. For example, memory segment 4-i is divided into memory sub arrays 4-i1, 4-i2, 4-i3 and 4-i4. The sub arrays disposed to align in the column direction such as sub arrays 4-11, 4-21, . . . , 4-161 form one bank. Therefore, memory array 1 is divided into four banks #1–#4. One bank includes memory cells arranged in 4K rows and 256 columns.

Global IO buses Ga, Gb, Gc and Gd corresponding to banks #1–#4 respectively are disposed to extend in the column direction over memory segments 4-1 to 4-16. As will be described later, the bit width of global IO buses Ga–Gd is determined in accordance with the number of bits (or burst length) of the input/output data. In the description below, it is assumed that each of global IO buses Ga–Gd has a 1-bit width for simplicity.

Figure 17:
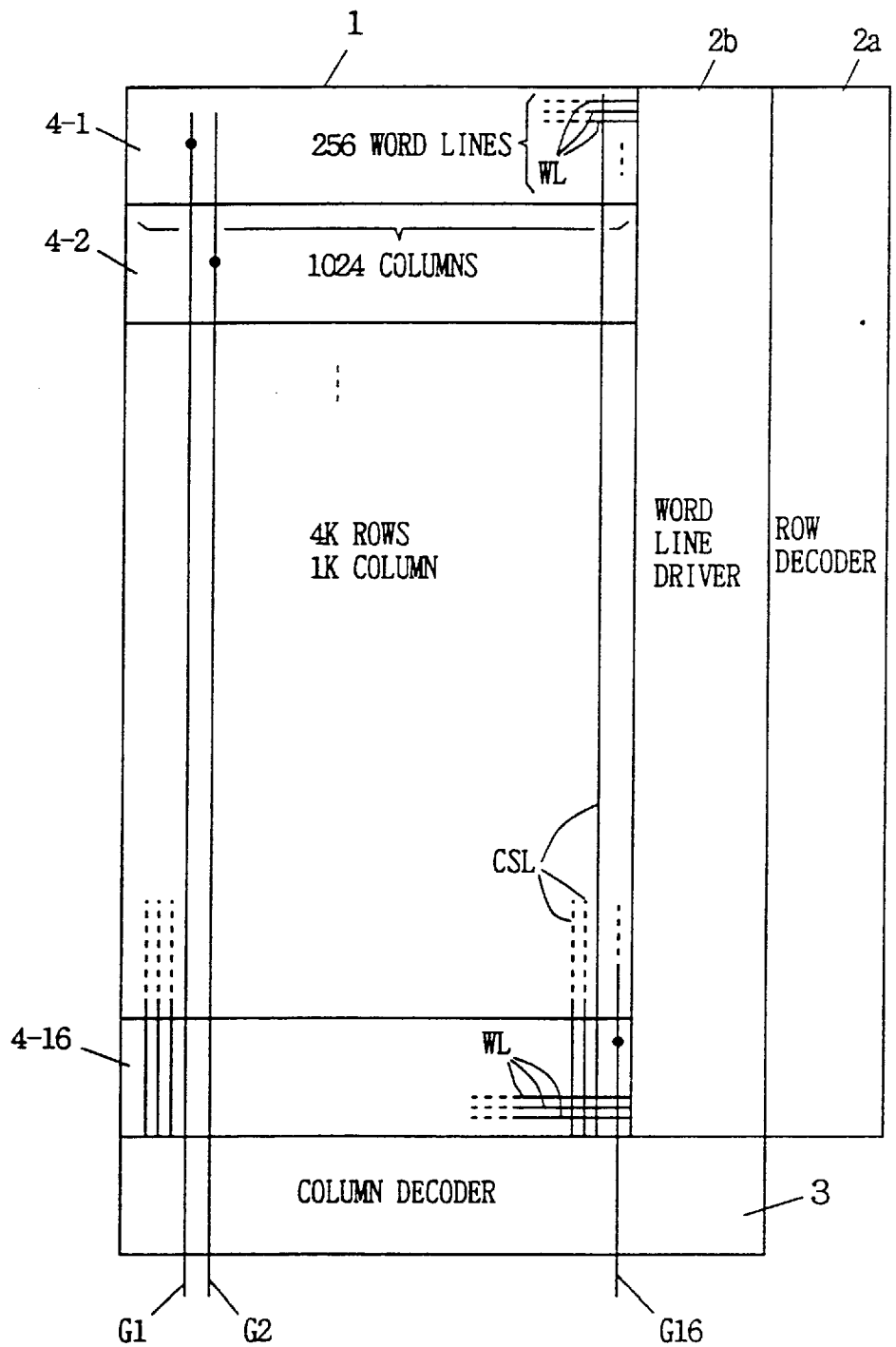
FIG. 17 is a diagram schematically showing a configuration of a memory array in a conventional DRAM.
Figure 18:
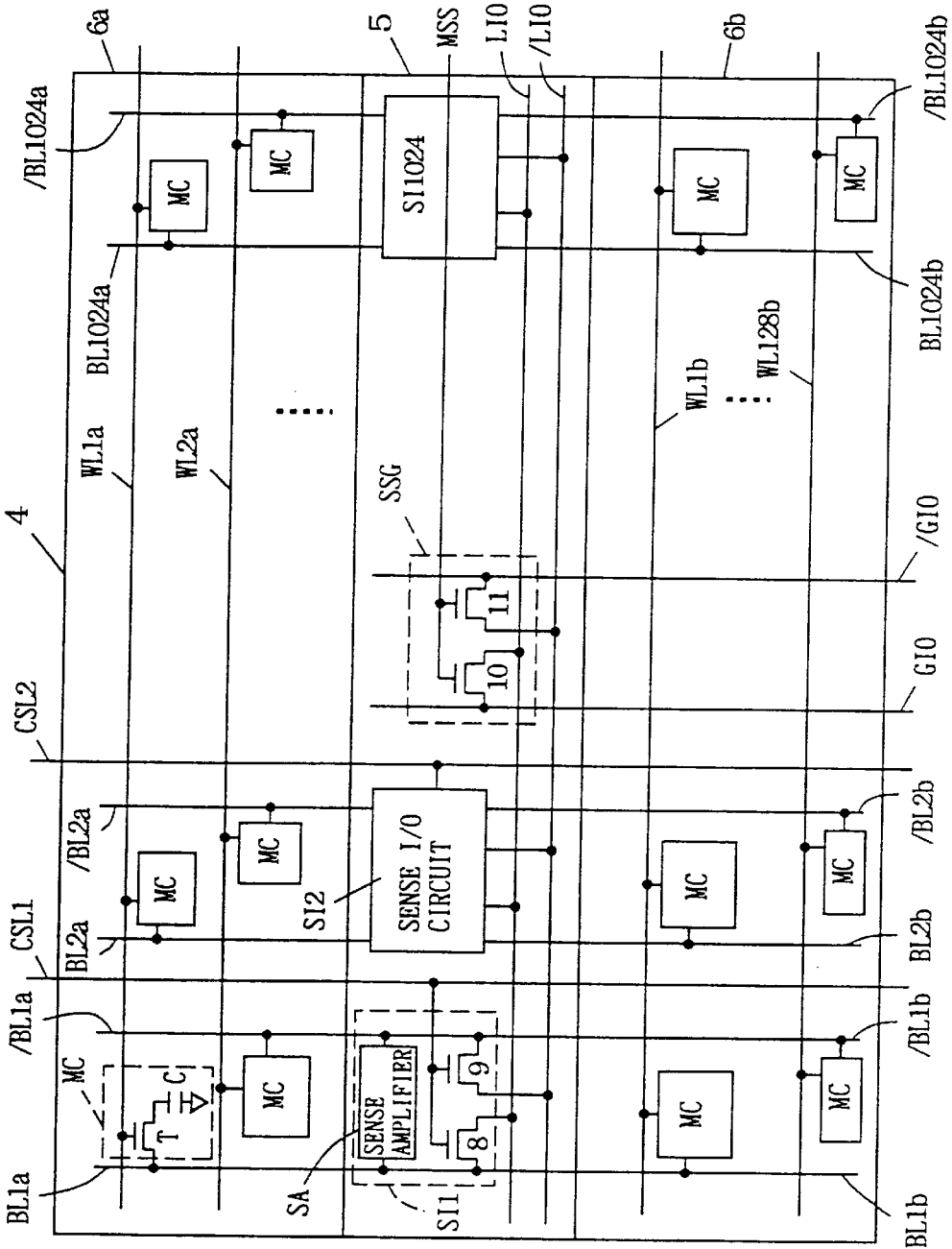
FIG. 18 is a diagram showing more specifically the configuration of the memory array shown in FIG. 17.
Figures 19A, 19B:
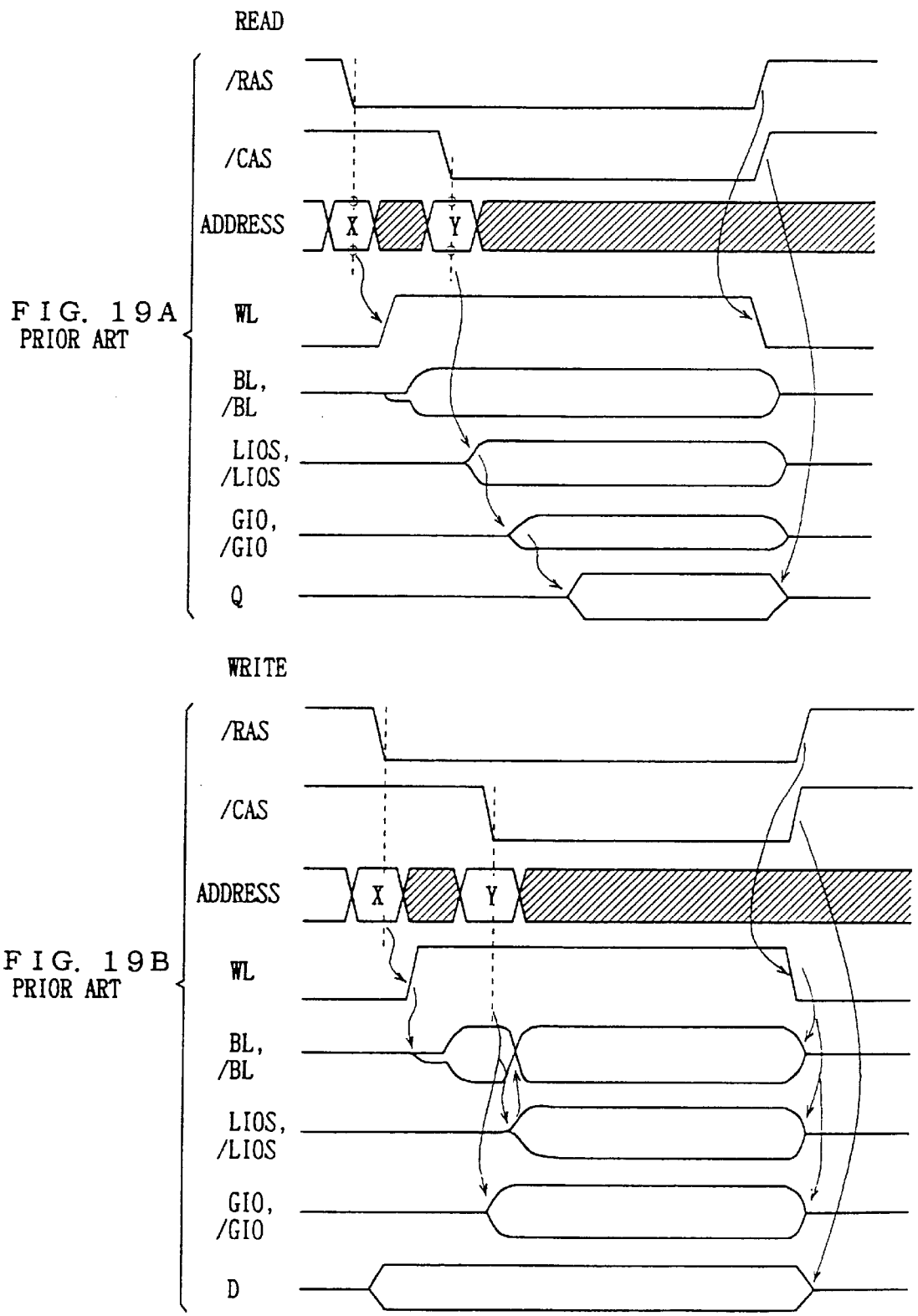
FIGS. 19A and 19B are signal waveforms illustrating operation upon reading and writing of data, respectively, of a synchronous semiconductor memory device shown in FIG. 18.
Figure 20:
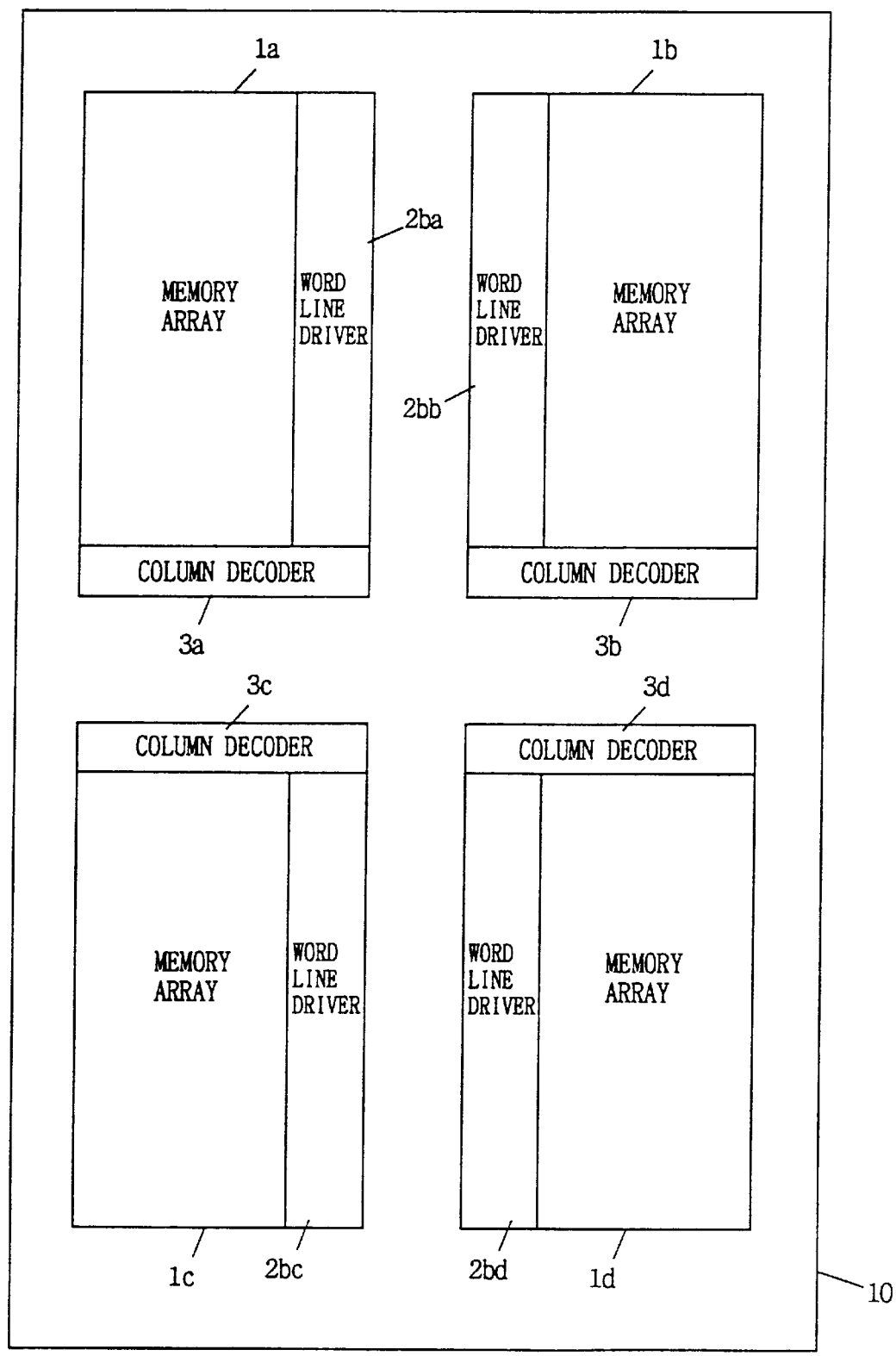
FIG. 20 is a diagram showing an arrangement of the arrays of the conventional DRAM on a chip.
Figure 21:
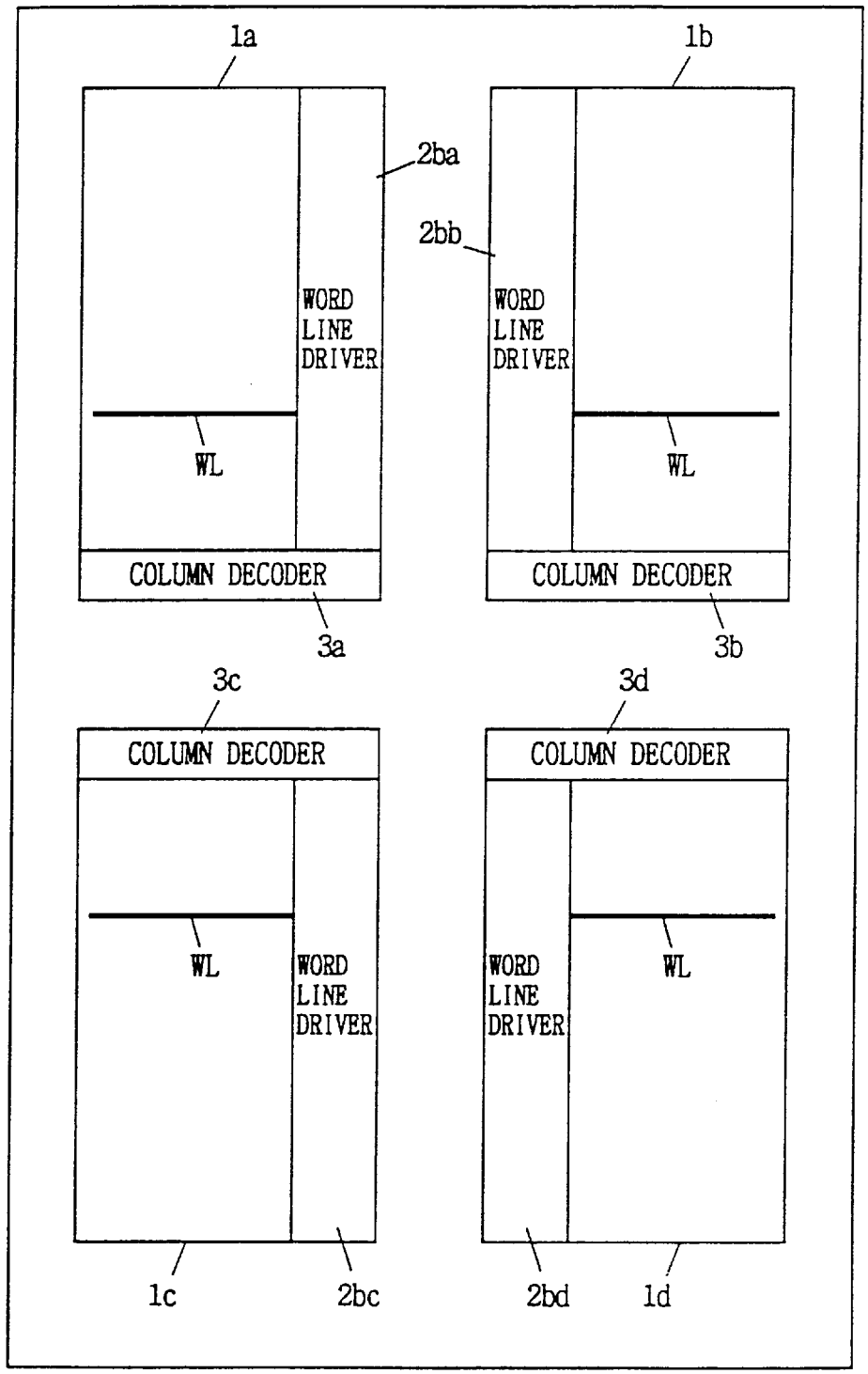
FIG. 21 is a diagram illustrating how word lines are selected in the conventional DRAM.
Figure 22:
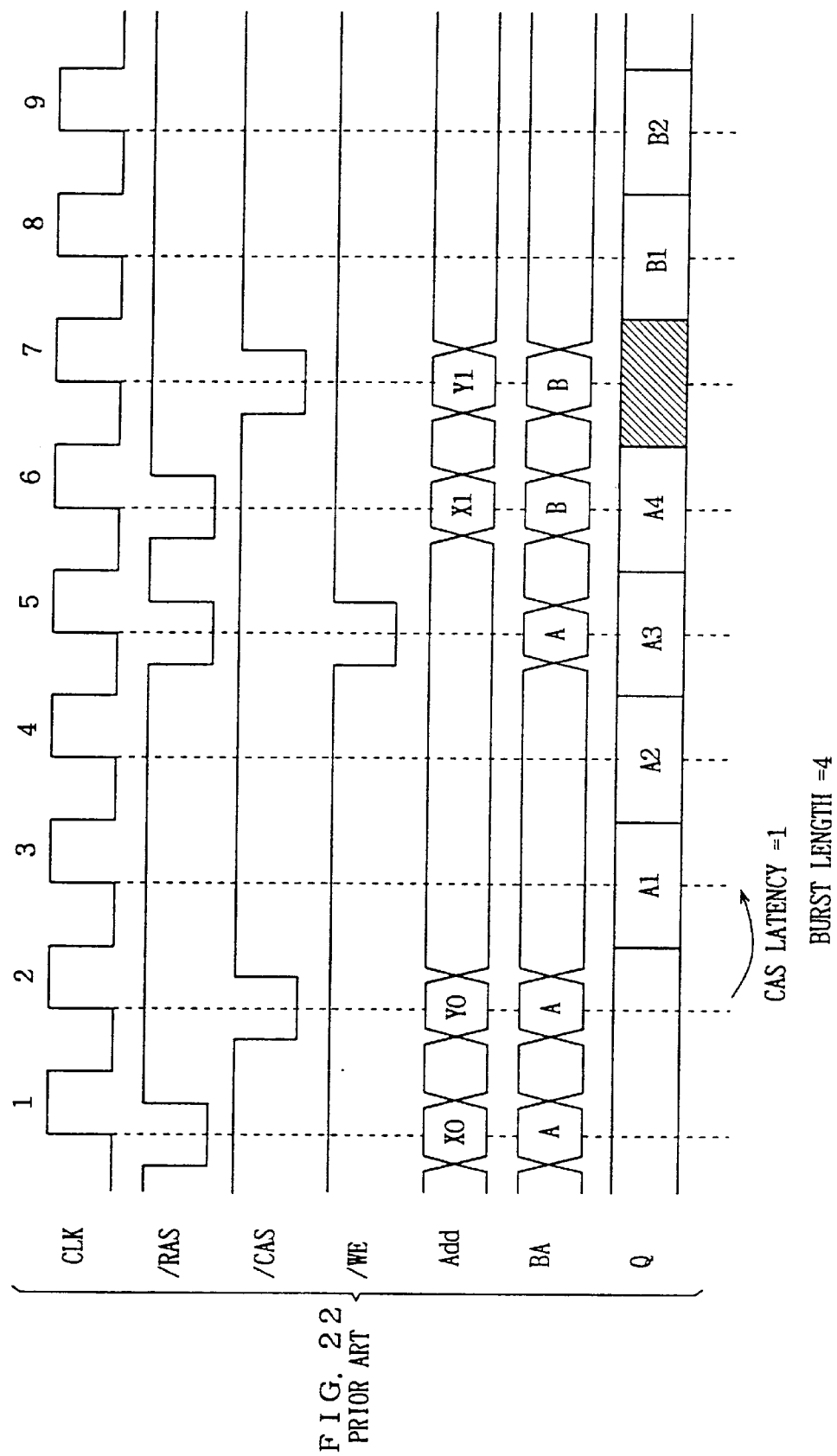
FIG. 22 is a timing chart illustrating operation upon data readout of a conventional SDRAM.
Figure 23:
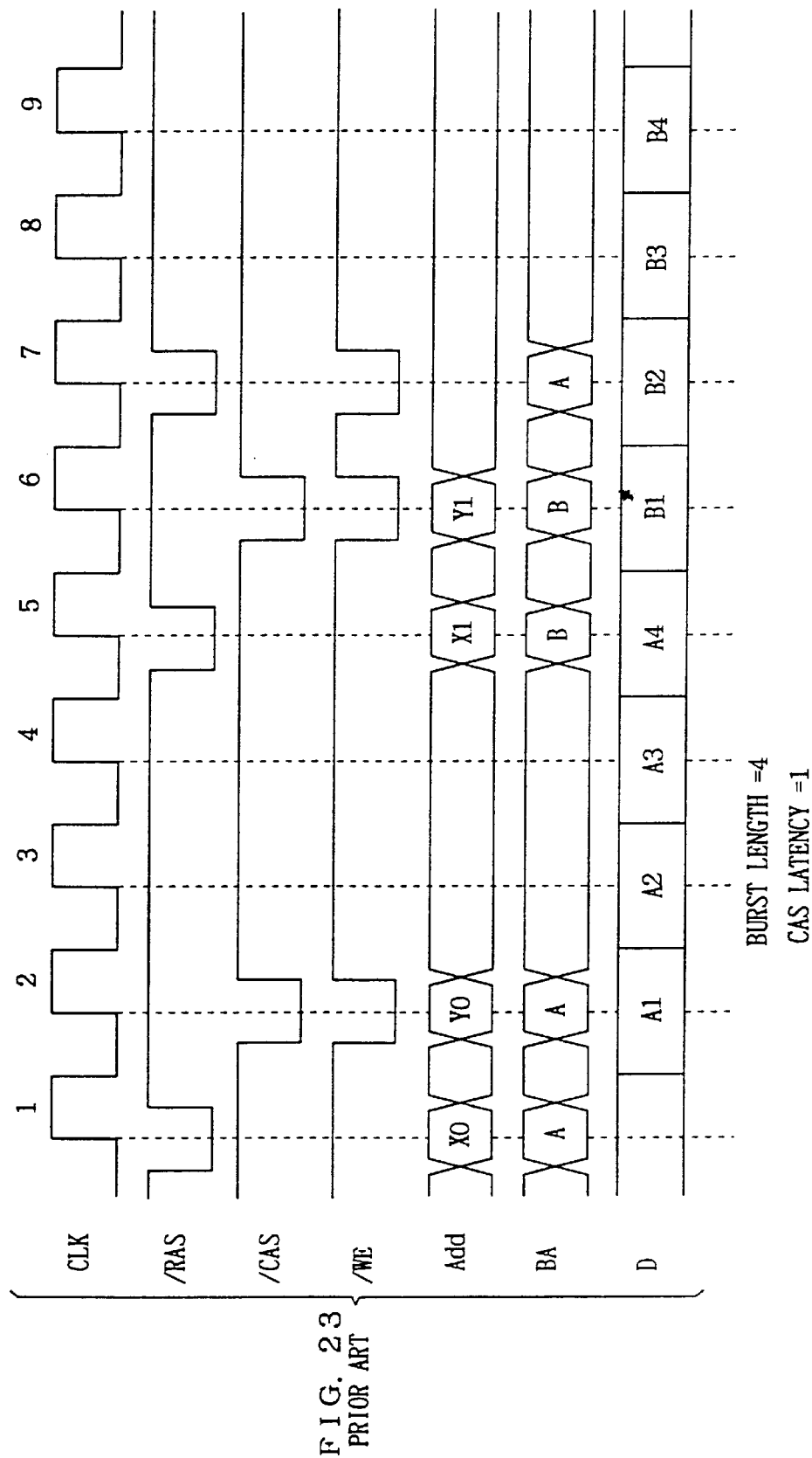
FIG. 23 is a timing chart illustrating operation upon writing of data of the conventional SDRAM.
Figure 24:
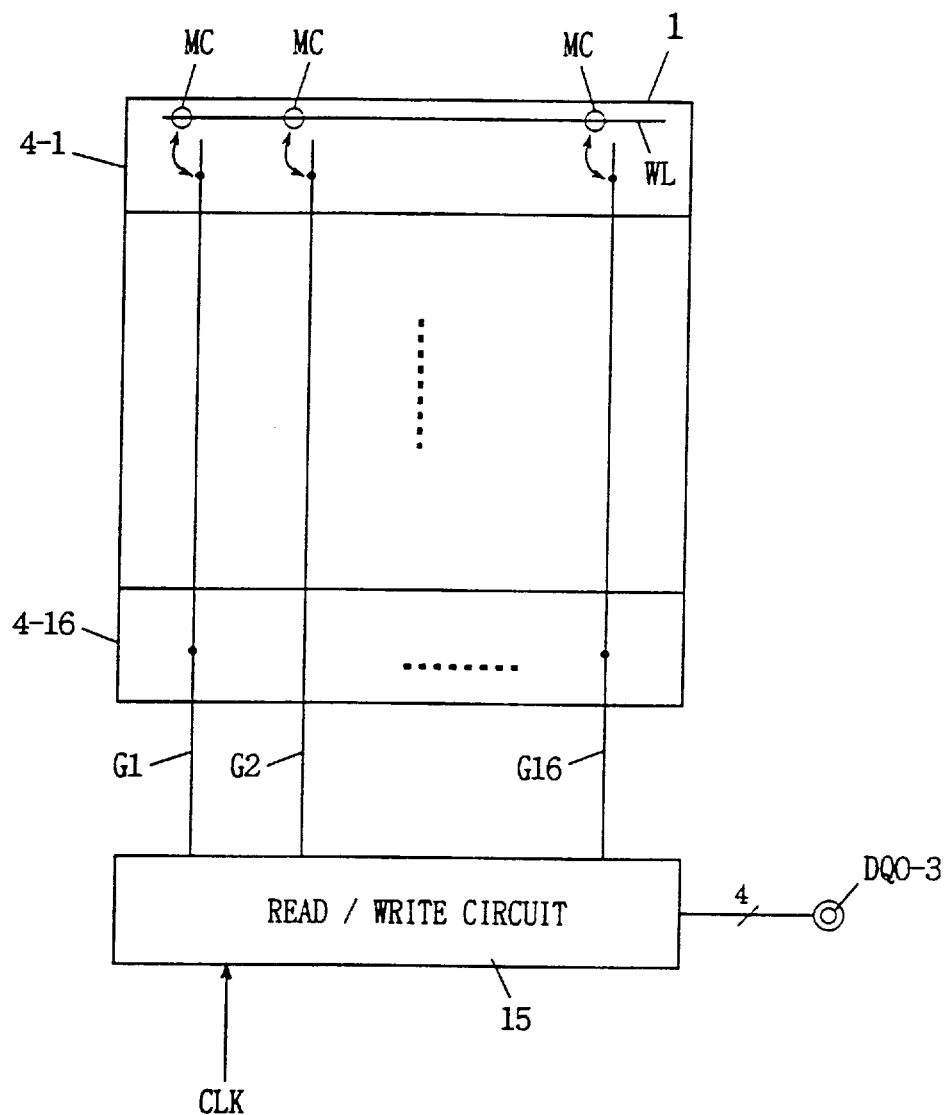
FIG. 24 is a diagram schematically showing a configuration upon reading/writing of data from/to one memory array of the conventional SDRAM.
Figure 25:
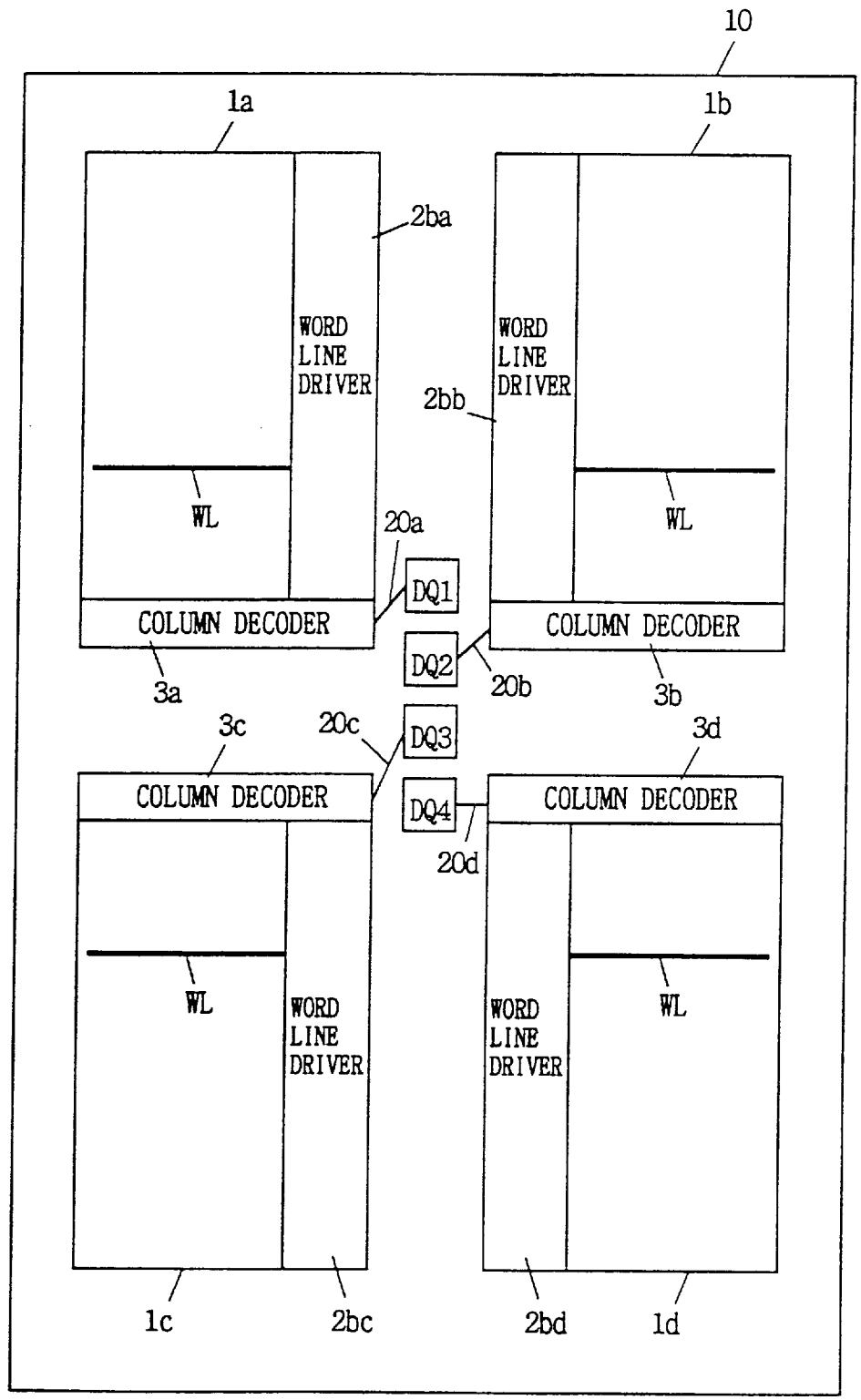
FIG. 25 is a diagram illustrating how a memory mat and a data input/output terminal are connected in the conventional DRAM.
Figure 26:
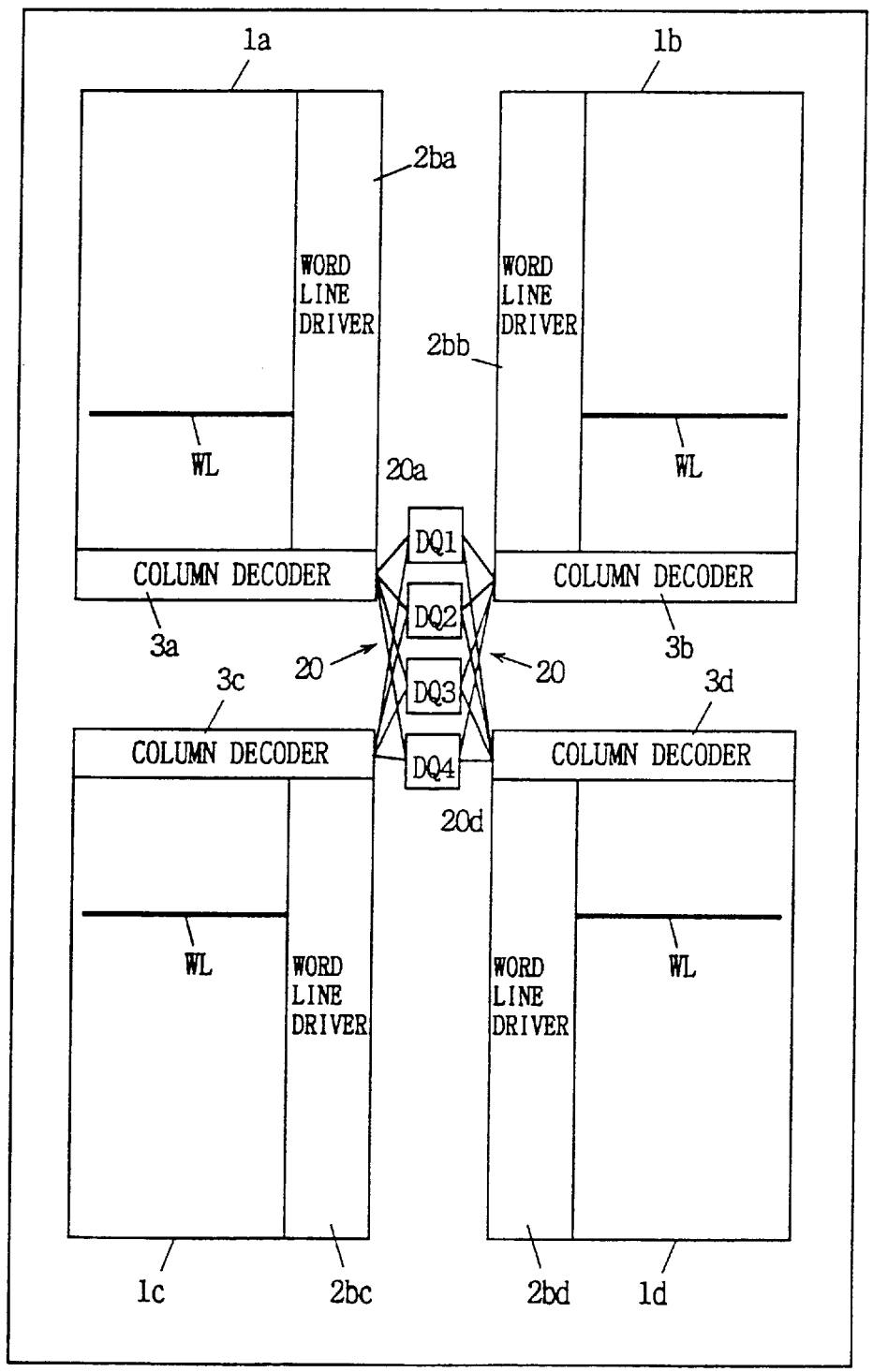
FIG. 26 is a diagram for use in describing a problem of the conventional SDRAM.
Figure 27:
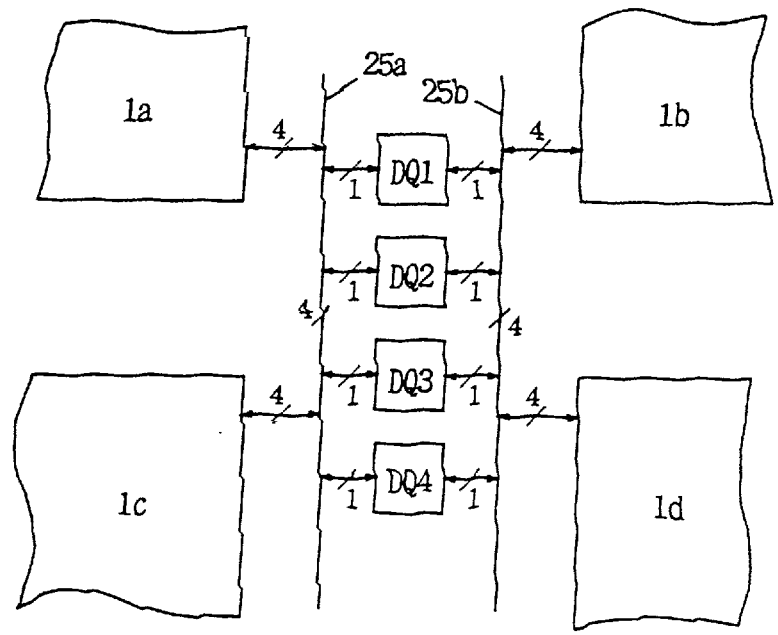
FIG. 27 is a diagram for use in describing a method of solving the problem of the conventional SDRAM.
Figure 28:
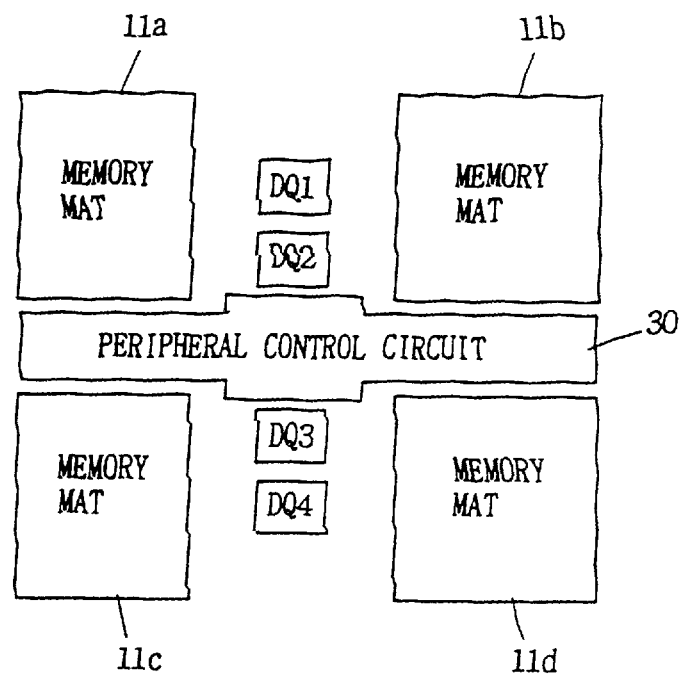
FIG. 28 is a diagram for use in describing a problem associated with the solution shown in FIG. 27.

Corresponding to banks #1–#4, a column decoder 3 is divided into sub column decoders 3-1 to 3-4, respectively. Column selection lines CSL are disposed to extend over memory segments 4-1 to 4-16 in the column direction from each of sub column decoders 3-1 to 3-4. This column selection line CSL is identical to that of the conventional DRAM shown in FIG. 17 described previously. In memory array 1, a row decoder 2a and a word line driver 2b are arranged to select, in accordance with a row address signal, the corresponding row. Row decoder 2a decodes the applied row address signal and outputs a row selection signal which specifies the row in the selected memory segment. In accordance with the row selection signal (word line selection signal) from row decoder 2a, word line driver 2b drives the corresponding word line to the selected state. Only the specified word line attains the selected state in the activated bank, as can be seen from the detailed description made later of a configuration for transmitting the drive signal from word line driver 2b to the word line in the sub array in each memory segment.

Sub column decoders 3-1 to 3-4 are activated only when the corresponding bank is designated. The decoders decode an applied column address signal and drive the corresponding column selection line to the selected state.

Each of global IO buses Ga–Gd is disposed to achieve communication of data with all the sub arrays included in the corresponding bank (the configuration thereof will be described later). For example, in bank #1, global IO bus Ga can communicate data with each of sub arrays 4-11, 4-21, . . . , 4-161. By thus arranging the global IO buses so as to communicate data with all the sub arrays provided in the corresponding bank, the number of global IO buses is reduced and therefore the area occupied by interconnections is reduced as compared to the configuration in which the global IO bus is provided for each sub array.

Memory mat 11 can communicate data with a data input/output terminal DQ determined uniquely. More specifically, each of global IO buses Ga–Gd can communicate data only with a predetermined one of data input/output terminals DQ. Therefore, in memory mat 11, the selected (active) bank communicate data with an outside of the memory always through the corresponding data input/output terminal DQ, whichever one of banks #1–#4 is selected. Thus, connection between memory mat 11 and data input/output terminal DQ is determined uniquely, eliminating the need for providing interconnections for connecting memory mat 11 to a plurality of data input/output terminals, so that arrangement of interconnections for data input/output becomes simpler. In addition, the area occupied by these interconnections can be significantly reduced. Since an interconnection connects to a proximate data input/output terminal (DQ pad), an interconnection line is reduced in length and data can be transferred at a high speed.

Figure 2:
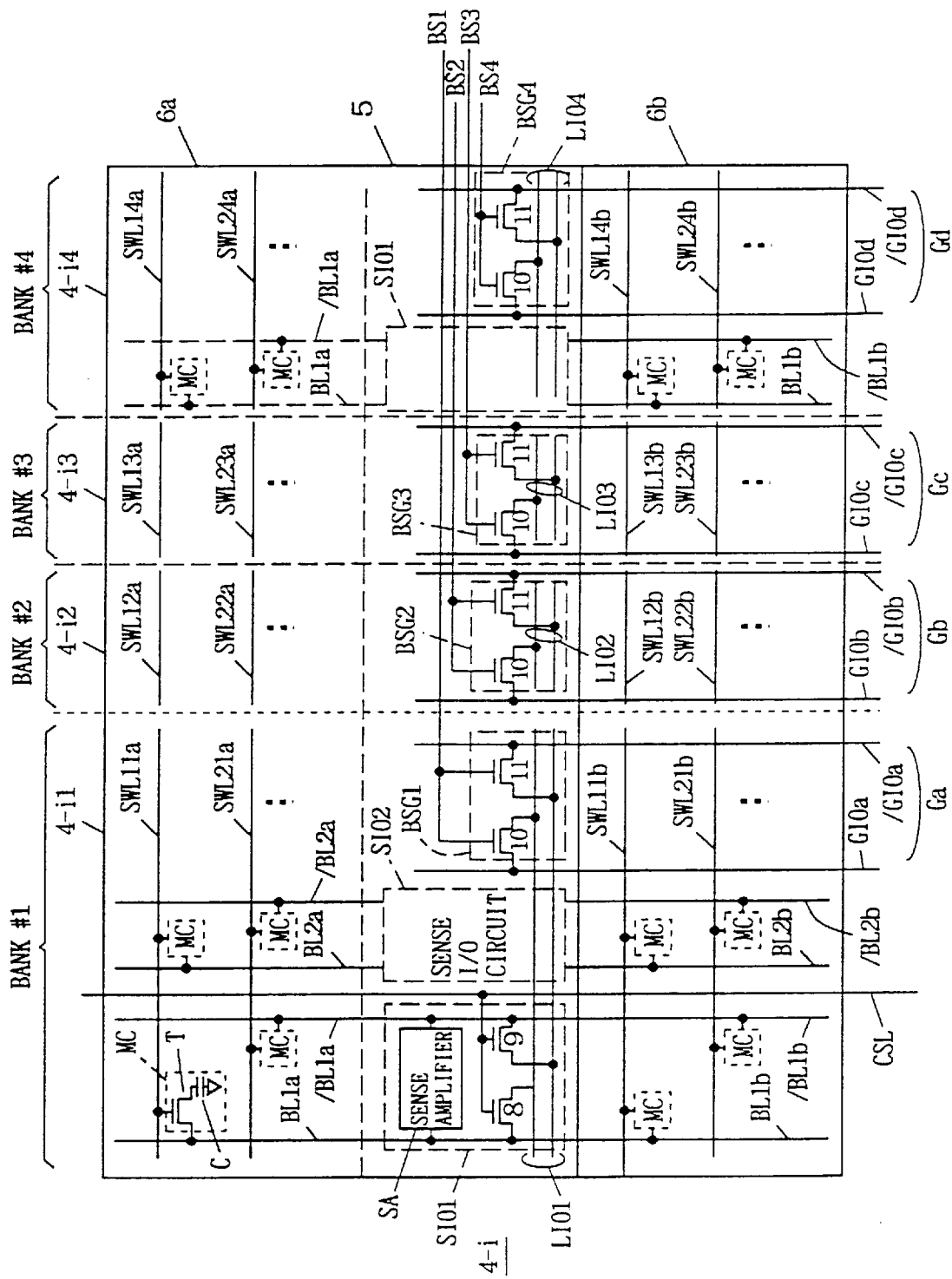
FIG. 2 is a diagram showing in more detail a configuration of a memory segment shown in FIG. 1.

FIG. 2 is a diagram showing in more detail the configuration of one memory segment 4-i in the memory array shown in FIG. 1. Referring to FIG. 2, memory segment 4-i includes two memory portions 6a and 6b and a sense amplifier band 5 disposed between memory portions 6a and 6b. Each of memory cell portions 6a and 6b includes a plurality of memory cells MC arranged in a matrix of rows and columns. Memory cell MC includes a capacitor C and an access transistor T. Respective columns of memory cell portions 6a and 6b are disposed to align in the column extending direction. Memory cell portions 6a and 6b are both divided into four sub arrays 4-i1, 4-i2, 4-i3 and 4-i4. Sub arrays 4-i1 to 4-i4 correspond to banks #1–#4, respectively.

Respective rows of the memory cells in sub arrays 4-i1 to 4-i4 are disposed to align in the row extending direction as the configuration thereof described later.

In sub array 4-i1 of memory cell portion 6a, bit line pairs BL1a, /BL1a and BL2a, /BL2a are shown representatively. In sub array 4-i4, bit lines BL1a, /BL1a are shown representatively. In sub array 4-i1 of memory cell portion 6b as well, bit line pairs BL1b, /BL1b and BL2b, /BL2b are shown representatively, and bit lines BL1b, /BL1b are shown representatively in sub array 4-i4 of memory cell portion 6b. The bit line pair is labeled with the same reference character in sub arrays 4-i1 and 4-i4 because these sub arrays correspond to the banks and each column in the bank has the same address number.

In each of sub arrays 4-i1 to 4-i4, a sub word line SWL is disposed to extend in the row direction only in that sub array. FIG. 2 shows representatively four sub word lines in each of sub arrays 4-i1 to 4-i4. More specifically, sub word lines SWL 11a, SWL 21a, SWL 11b and SWL 21b are shown representatively in sub array 4-i1; and sub word lines SWL 12a, SWL 22a, SWL 22b and SWL 22b are shown representatively in sub array 4-i2. Sub word lines SWL13a, SWL23a, SWL13b and SWL23b are shown representatively in sub array 4-i3; and sub word lines SWL 14a, SWL 24a, SWL14b and SWL24b are shown representatively in sub array 4-i4. Memory cell MC is disposed at a crossing of such word line SWL (indicating the sub word line representatively) and the bit line pair.

By thus arranging the sub word lines in each of sub arrays 4-i1 to 4-i4 extending only in the corresponding sub array, a sub word line can be driven to the selected state to access a memory cell in one sub array when a memory cell in another sub array is selected, allowing easy implementation of the bank configuration. The configuration of the word lines will be described later again in further detail.

In sense amplifier band 5, sense IO circuits SIO1, SIO2, . . . , are provided corresponding to the bit line pairs arranged corresponding to respective columns in memory cell portions 6a and 6b. Since one sub array 4-ij (j=1-4) has the memory cells in 256 columns, 256 sense IO circuits are provided in one sub array 4-ij. Sense IO circuits SIO (SIO1, SIO2, . . . ) includes a sense amplifier SA for differentially amplifying the potential on the corresponding bit line pair BL, /BL (indicating the bit lines representatively) and transmission gates 8 and 9 responsive to the column selection signal applied through column selection line CSL for connecting the corresponding bit line pair (the sensing node of sense amplifier SA) to the corresponding local IO bus LIO. In sense amplifier band 5, the local IO bus is arranged to be divided corresponding to sub arrays 4-i1 to 4-i4. A local IO bus LIO1 is disposed in sub array 4-i1, a local IO bus LIO2 is disposed in sub array 4-i2, a local IO bus LIO3 is disposed in sub array 4-i3 and a local IO bus LIO4 is disposed in sub array 4-i4.

Glob al IO buses (Ga–Gd) are provided corresponding to respective sub arrays 4-i1 to 4-i4. In FIG. 2, these global IO buses Ga–Gd are each shown as formed by a pair of complementary signal lines (for input/output of 1 bit data). More specifically, global IO lines GIOa, /GIOa are provided for sub array 4-i1, global IO lines GIOb, /GIOb for sub array 4-i2, global IO lines GIOc, /GIOc for sub array 4-i3, and global IO lines GIOd, /GIOd for sub array 4-i4.

Block selection gates BSG1–BSG4 which are rendered conductive in response to sub array selection signals BS1–BS4 are arranged to connect local IO buses LIO1–LIO4 with the corresponding global IO buses Ga–Gd. Each of block selection gates BSG1–BSG4 is formed by two transmission gates 10 and 11 to interconnect the complementary signal line pairs. Block selection gate BSG1 connects local IO bus LIO1 to global IO bus Ga (GIOa, /GIOa) in response to sub array selection signal BS1. Block selection gate BSG2 connects local IO bus LIO2 to global IO bus Gb in response to sub array selection signal BS2. Block selection gate BSG3 connects local IO bus LIO3 to global IO bus Gc in response to sub array selection signal BS3. Block selection gate BSG4 connects local IO bus LIO4 to global IO bus Gd in response to sub array selection signal BS4.

Block selection gates BSG1–SG4 are provided in the sub arrays of each of memory segments 4-1 to 4-16 shown in FIG. 1. Global IO buses Ga–Gd are disposed in the column direction over memory segments 4-1 to 4-16 and can be connected to any local IO bus in the corresponding sub array column (bank).

By thus forming local IO bus LIO (LIO1–LIO4) and global IO buses Ga–Gd each by a complementary signal line pair, signals make changes complementarily and therefore the signal amplitude is increased even if the signal amplitude on one signal line is small, thereby achieving accurate and fast data transfer. In addition, since they are formed by complementary signal line pairs, two transmission gates 8 and 9 can be arranged in sense IO circuit SIO, whereby loads of sensing nodes of sense amplifier SA are equal to each other. Furthermore, two transmission gates 10 and 11 can be arranged in each of block selection gates BSG1–BSG4, thereby balancing the loads of local IO bus LIO and global IO bus G (Ga–Gb).

Global IO buses Ga–Gd can be arranged at the boundary region of the sub arrays or at a desired empty region (for example, at a word line shunt region if such a word line shunt region is provided).

although not clearly shown in FIG. 2, sense amplifier SA included in sense amplifier band 5 is controlled to be active/inactive individually in each bank or each of sub arrays 4-i1 to 4-i4.

Figure 3:
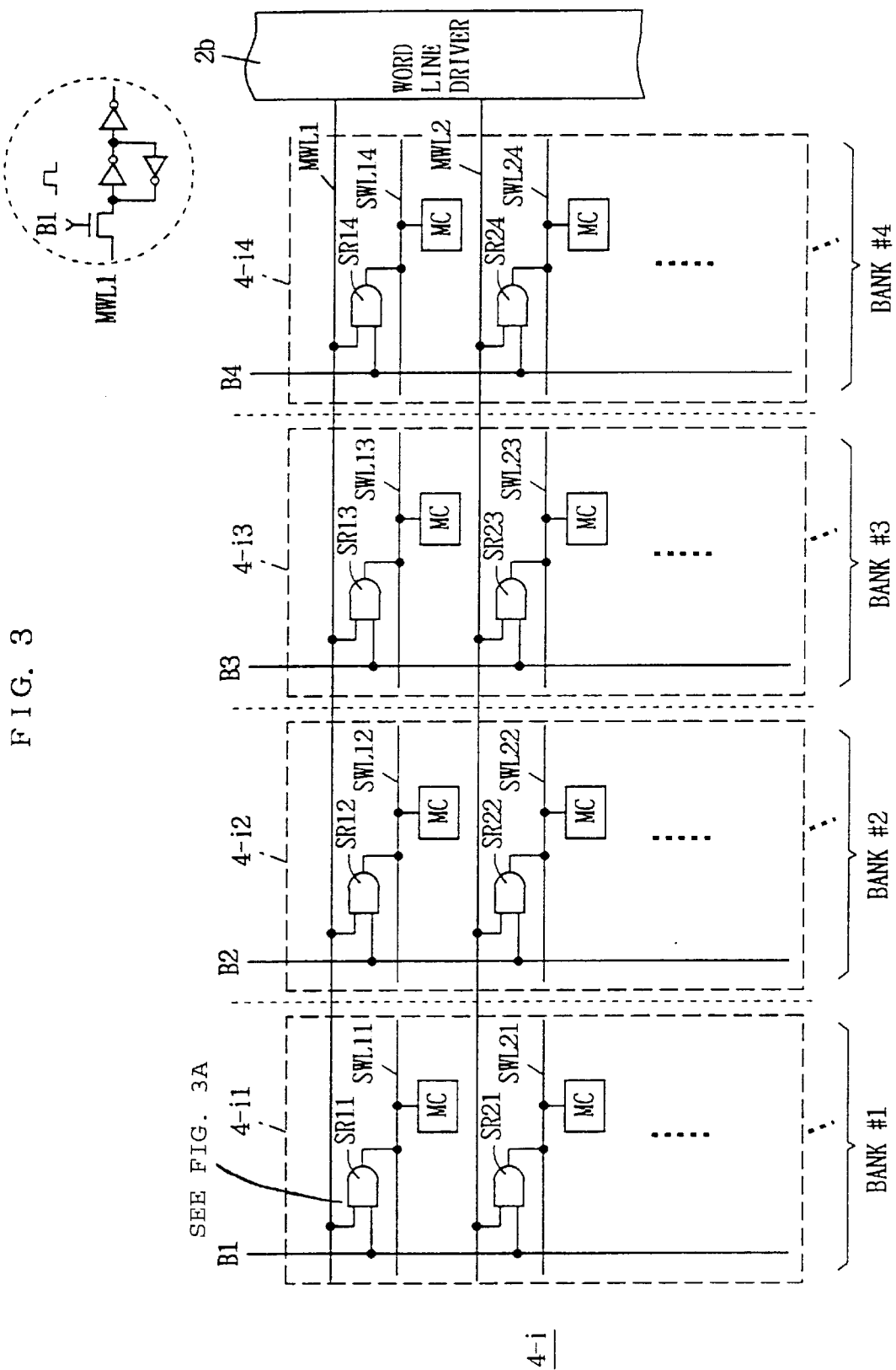

FIG. 3 shows an arrangement of word lines in memory segment 4-i shown in FIG. 2. Referring to FIG. 3, main word lines MWL1, MWL2, . . . , are arranged extending in the row direction in common to sub arrays 4-i1 to 4-i4. Main word lines MWL1, MWL2, . . . , are connected to an output portion of word line driver 2b and transmit the word line selection signal from word line driver 2b.

In sub arrays 4-i1 to 4-i4, sub word lines SWL (SWL11–SWL14, SWL21–SWL24) are arranged corresponding to the rows of memory cells. The memory cells in one row in the corresponding sub array are connected to each sub word line SWL. A sub word line drive gate SRmn is arranged at an intersection of main word line MWLm (m=1-256) and sub word line SWLmn (m=1-256, n=1-4). Sub word line drive gate SRmn receives a bank selection signal Bn and a signal on the corresponding main word line MWLm. When both of the signal potentials of bank selection signal Bn and main word line MWLm are active, sub word line drive gate SRmn drives the corresponding sub word line SWLmn to the selected state. Since sub word line SWL connected to the memory cells in the corresponding row and extending only in the corresponding sub array is arranged in each of sub arrays 4-i1 to 4-i4 and main word line MWL for transmitting the word line selection signal from word line driver 2b is arranged common to sub arrays 4-i1 to 4-i4, when a memory cell is selected in a sub array another sub array can be driven to the selected state to access a memory cell independently from operations of the selected sub array.

Bank selection signals B1–B4 can be transmitted common to the sub arrays in each bank, or can be active only in one segment similarly to sub array selection signals BS1–BS4.

Figure 4:
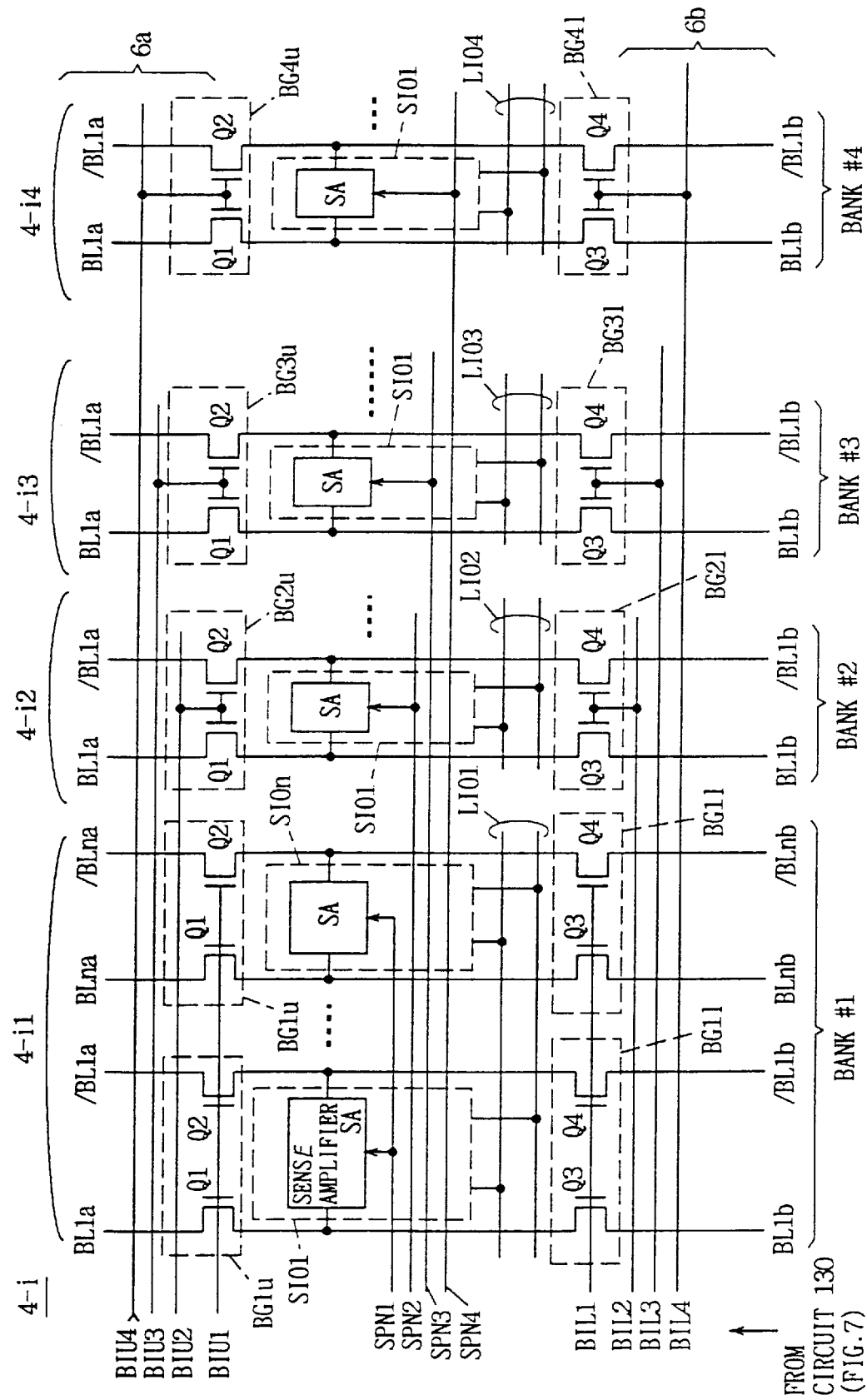
FIG. 4 is a diagram showing in more detail a configuration of a sense amplifier band shown in FIG. 2.

FIG. 4 shows the sense amplifier band in FIG. 2 in further detail. For simplicity, FIG. 4 does not show transmission gates 8 and 9 for connecting local IO bus LIO and the bit line pair. Referring to FIG. 4, sense IO circuit SIO and the corresponding bit line pair are electrically connected through a bit line isolation gate BG. More specifically, in sub array 4-i1 included in bank #1, sense IO circuit SIO1 is connected to bit line pair BL1a, /BL1a through a bit line isolation gate BG1u, and to bit lines BL1b, /BL1b through a bit line isolation gate BG1l. Sense IO circuit SIOn (n=256) is connected to bit lines BLna, /BLna through bit line isolation gate BG1u, and electrically connected to bit lines BLnb, /BLnb through bit line isolation gate BG1l.

In bank #2, sense IO circuit SIO1 is electrically connected to bit lines BL1a, /BL1a through a bit line isolation gate BG2u, and to bit lines BL1b, /BL1b through a bit line isolation gate BG2l. In bank #3 as well, sense IO circuit SIO1 is electrically connected to bit lines BL1a, /BL1a through a bit line isolation gate BG3u, and to bit lines BL1b, /BL1b through a bit line isolation gate BG3l. In bank #4, sense IO circuit SIO1 is electrically connected to bit lines BL1a, /BL1a through a bit line isolation gate BG4u and to bit lines BL1b, /BL1b through a bit line isolation gate BG4l. Although only one sense IO circuit SIO1 is shown representatively in banks #2–#4 in FIG. 4, 256 sense IO circuits are provided also in each of banks #2–#4 similarly to bank #1.

Bit line isolation gates BG1u, BG2u, BG3u and BG4u are each formed by transmission gates Q1 and Q2, while bit line isolation gates BG1l, BG2l, BG3l and BG4l are each formed by transmission gates Q3 and Q4.

Bit line isolation gate BG1u is controlled to be conductive/non-conductive by an isolation control signal BIU1. Bit line isolation gate BG2u is controlled to be conductive/non-conductive by an isolation control signal BIU2. Bit line isolation gates BG3u and BG4u are controlled to be conductive/non-conductive by isolation control signals BIU3 and BIU4, respectively. Bit line isolation gate BG1l is controlled to be conductive/non-conductive by an isolation control signal BIL1. Bit line isolation gate BG2l is controlled to be conductive/non-conductive by isolation control signal BIL2. Bit line isolation gates BG3l and BG4l are controlled to be conductive/non-conductive by isolation control signals BIL3 and BIL4, respectively.

Sense amplifier SA included in sense IO circuit SIO1–SIOn in bank #1 is activated by a sense amplifier activation signal SPN1. Sense amplifier SA included in sense IO circuit SIO1 in bank #2 is activated by a sense amplifier activation signal SPN2. Sense amplifier SA included in sense IO circuit SIO1 in bank #3 is activated in response to a sense amplifier activation signal SPN3. Sense amplifier SA included in sense IO circuit SIO1 in bank #4 is activated by a sense amplifier activation signal SPN4. Sense amplifier SA has a cross-couple of N channel MOS transistors and a cross-couple of P channel MOS transistors, and sense amplifier activation signal SPN activates both of the cross-couples.

The bit line isolation gates and the sense amplifiers SA are controlled on the bank-by-bank basis. The memory cell portion including the selected memory cell is connected to sense amplifier SA through the corresponding bit line isolation gate, while the non-selected memory cell portion forming a pair with the selected memory cell portion is disconnected from sense amplifier SA. In the remaining banks, the bit line isolation gates maintain the conductive state and sense amplifiers SA are electrically connected to the corresponding bit line pairs. For example, when bank #1 is designated and a memory cell in memory cell portion 6a of sub array 4i-1 is selected, bit line isolation gate BG1u maintains the conductive state by isolation control signal BIU1, while isolation gate BG1l is rendered non-conductive by isolation control signal BIL1. In the remaining sub arrays 4-i2 to 4, bit line isolation gates BG2u, BG2l, BG3u, BG3l, BG4u and BG4l are activated with the corresponding isolation control signals BIU2–BIU4, and BIL2–BIL4 at a high level, and respective corresponding bit line pairs are electrically connected to sense amplifiers SA. In this state, a sub word line is driven to the selected state and memory cell data is transmitted to sense amplifier SA in memory cell portion 6a of bank #1. Next, sense amplifier activation signal SPN1 is activated and sense amplifier SA is activated to perform sensing operation, thereby sensing and amplifying the memory cell data.

Such shared sense amplifier configuration as illustrated in FIG. 4 enables reduction in length of the bit line connected to sense amplifier SA during operation of the sense amplifier and therefore reduction in load capacitance of the sensing node of sense amplifier SA, thereby increasing the readout voltage (voltage read out from the memory cell onto the bit line) and allowing stable and fast sensing operation.

In addition, by thus alinedly arranging sense amplifiers SA in a line, the sense amplifier and the bit line isolation gate are easily controlled to be active/inactive and conductive/non-conductive, respectively, on the bank-by-bank basis even if one memory array is divided into a plurality of banks. Next, a brief description will be made of data readout operation with reference to the timing chart shown in FIG. 5.

Figure 5:
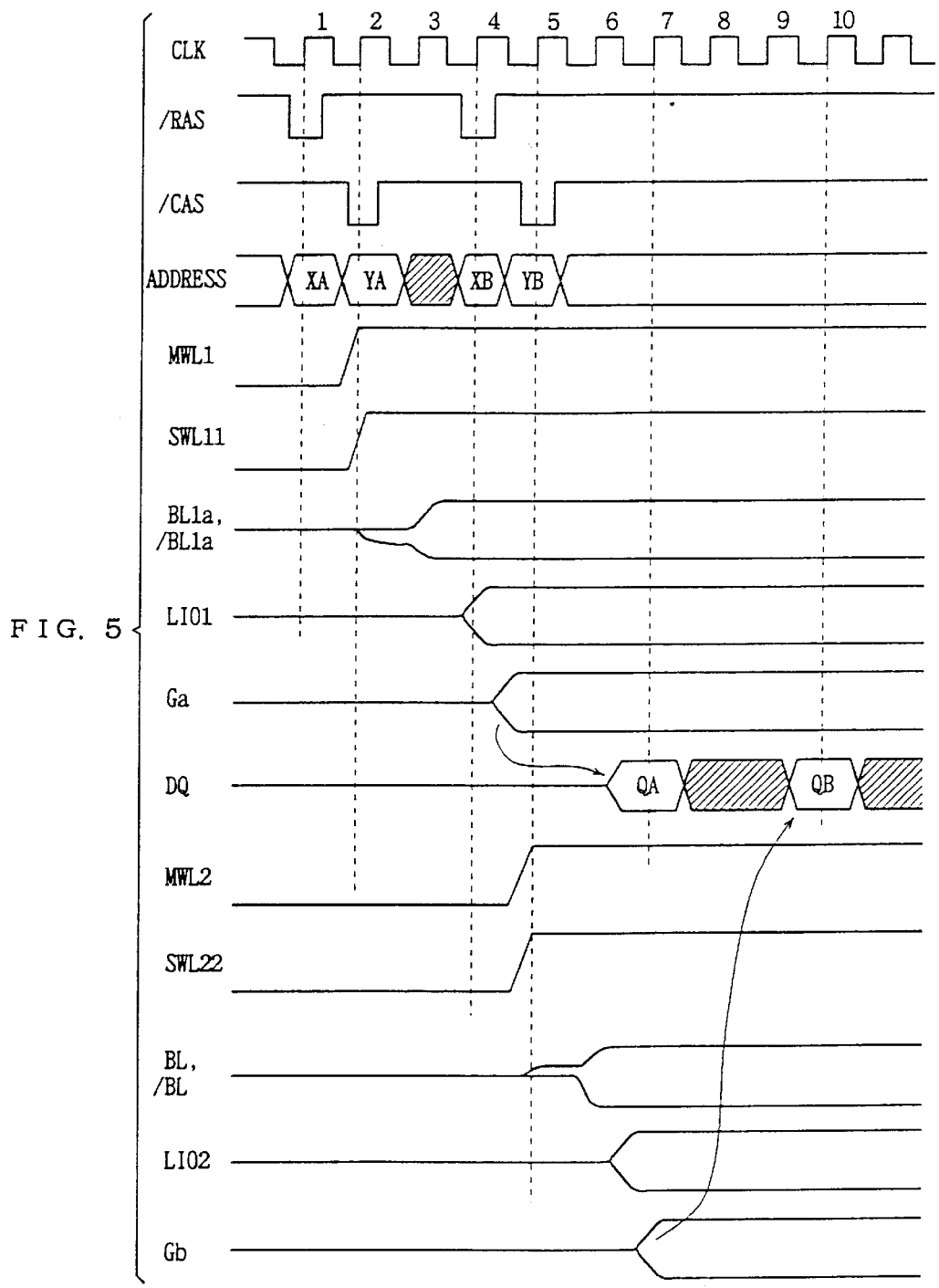
FIG. 5 is a signal waveforms illustrating operation upon data readout of the semiconductor device according to the first embodiment of the present invention.

FIG. 5 illustrates, as an example, an operation sequence in which data QA of the memory cell specified by addresses XA and YA (these include bank address) in bank #1 is read out, and then data QB of the memory cell specified by addresses XB and YB (these also include a bank address) in bank #2 is read out.

In clock cycle 1, at the rise of a clock signal CLK, a row address strobe signal /RAS is in an active state at a low level and in accordance with address signal XA applied at this point in time, bank #1 is designated and a row in bank #1 is designated. In accordance with address signal XA, the word line selection signal is generated by row decoder 2a and word line driver 2b and transmitted onto main word line MWL corresponding to the selected row. FIG. 5 shows as an example a state where main word line MWL1 is selected. Since the signal potential in main word line MWL1 is in an active state and the bank address designates bank #1, bank selection signal B1 attains an active state and sub word line driver SR11 (see FIG. 3) is activated, thereby driving sub word line SWL11 to the selected state in accordance with the word line selection signal transmitted to main word line MWL1. As a result, data stored in memory cells MC connected to sub word line SWL11 are transmitted to the corresponding bit line pairs. In FIG. 5, a state where the low level data is read out to bit line BL1a, /BL1a is shown as an example.

At this time, the memory cell portion including sub word line SWL11 is connected to sense amplifier SA through bit line isolation gate BG, while the non-selected memory cell portion in bank #1 is disconnected from sense amplifier SA by bit line isolation gate BG. The bit line isolation gates are in a conductive state in the remaining banks #2–#4.

Subsequently, in the clock cycle 2, at the rise of clock signal CLk a column address strobe signal /CAS is in an active state at a low level, and the address applied at this point in time is taken in as a column address signal YA, thereby selecting the corresponding column in bank #1. Sub column decoder 3-1 provided for bank #1 is activated in column decoder 3 to perform the column selection operation, thereby activating the column selection signal for the corresponding column. In accordance with the column selection signal on column selection line CSL, data sensed and amplified by sense amplifier SA on bit line pair BL1a and /BL1a is transmitted onto local IO bus LIO1 through transmission gates 8 and 9 included in sense IO circuit SIO, and data on local IO bus LIO1 changes to the potential corresponding to the memory cell data. Next, sub array selection signal BS1 shown in FIG. 2 attains an active state, and transmission gates 10 and 11 of block selection gate BSG1 are rendered conductive, so that data on local IO bus LIO1 is transmitted onto global IO bus Ga. Thereafter, data is transferred in synchronization with clock signal CLK, and decided data QA is read out in clock cycle 7.

In parallel to the operation above to read out data QA, in clock cycle 4, signal /RAS is activated again at a low level, and a row in bank #2 is designated by an address signal XB applied at this moment of time, whereby operation to select the designated row is performed; In bank #2 as well, the memory cell portion including the selected word line is connected to the sense amplifier and the non-selected memory cell portion is disconnected by the bit line isolation gate from the sense amplifier. Assuming the main word line MWL2 is designated by address signal XB, the word line selection signal from word line driver 2b is transmitted to main word line MWL2, and the potential on the main word line MWL2 rises to a high level. Since bank #2 is designated in accordance with address signal XB, bank selection signal B2 is in an active state at a high level and sub word line drive gate SR22 attains an active state, so that the potential of sub word line SWL22 provided corresponding to main word line MWL2 rises to a high level in bank #2. Consequently, data of memory cells MC connected to the selected sub word line SWL22 are transmitted onto the corresponding bit lines BL, /BL. In FIG. 5, a state where the high level data is read out to bit lines BL, /BL is shown as an example. Thereafter, sense amplifier SA is activated by sense amplifier activation signal SPN2 and data of the read-out memory cell is detected and amplified in the corresponding sense IO circuit SIO.

In parallel to this sensing operation, in clock cycle 5, column address strobe signal /CAS falls to a low level, address signal YB at this moment in time is incorporated as a column address signal and a bank address signal, and sub column decoder 3-2 provided corresponding to bank #2 attains an active state, so that column address signal YB is decoded by sub column decoder 3-2. In accordance with the decoded result, the column selection line included in bank #2 is selected and transmission gates 8 and 9 included in sense IO circuit SIO are rendered conductive, whereby data of bit lines BL, /BL is read out onto local IO bus LIO2. Next, sub array selection signal BS2 attains an active state and transmission gates 10 and 11 of block selection gate BSG2 provided in bank #2 turn on, so that data on local IO bus LIO2 is transmitted onto global IO bus Gb. Data which is read out to global IO bus Gb is transferred in accordance with the clock signal and output as readout data QB in clock cycle 10.

Since each sub array can be driven individually as described above, a memory cell can be selected and accessed even if another sub array is selected.

It is to be noted that internal operation of the SDRAM is shown as exaggerated to clarify the change in signals in the timing chart illustrated in FIG. 5. The potential of each signal line can change at a timing faster than that shown in FIG. 5. While CAS latency for outputting valid data is assumed as 5, this CAS latency can be reduced further.

As clearly illustrated in FIG. 4, bit line isolation gate BG (such as BG1u and BG1l) for connecting only the memory cell portion including the selected memory cell to the sense amplifier is provided in sense IO circuit SIO. In each sub array, only the memory cell portion connected to the selected memory cell is connected to the sense amplifier and the other non-selected memory cell portion is disconnected from sense amplifier SA. Such configuration itself is similar to a standard DRAM and is different simply in that operation of the bit line isolation gate is controlled with a sub array as one unit. In the sub array of the non-selected bank, each bit line is connected to sense IO circuit SIO and maintains a precharge state.

In the operation timing chart illustrated in FIG. 5, banks #1 and #2 attain a precharge state by activating signal /RAS and a write enable signal WE (not shown) to a low level at the rise of clock signal CLK. As a result, a precharge command is given and the designated bank is precharged.

Furthermore, in timing chart illustrated in FIG. 5, data of 1 bit is read out from the selected sub array. Therefore, 4-bit data can be obtained by activating the banks simultaneously in four memory mats.

Figure 6:
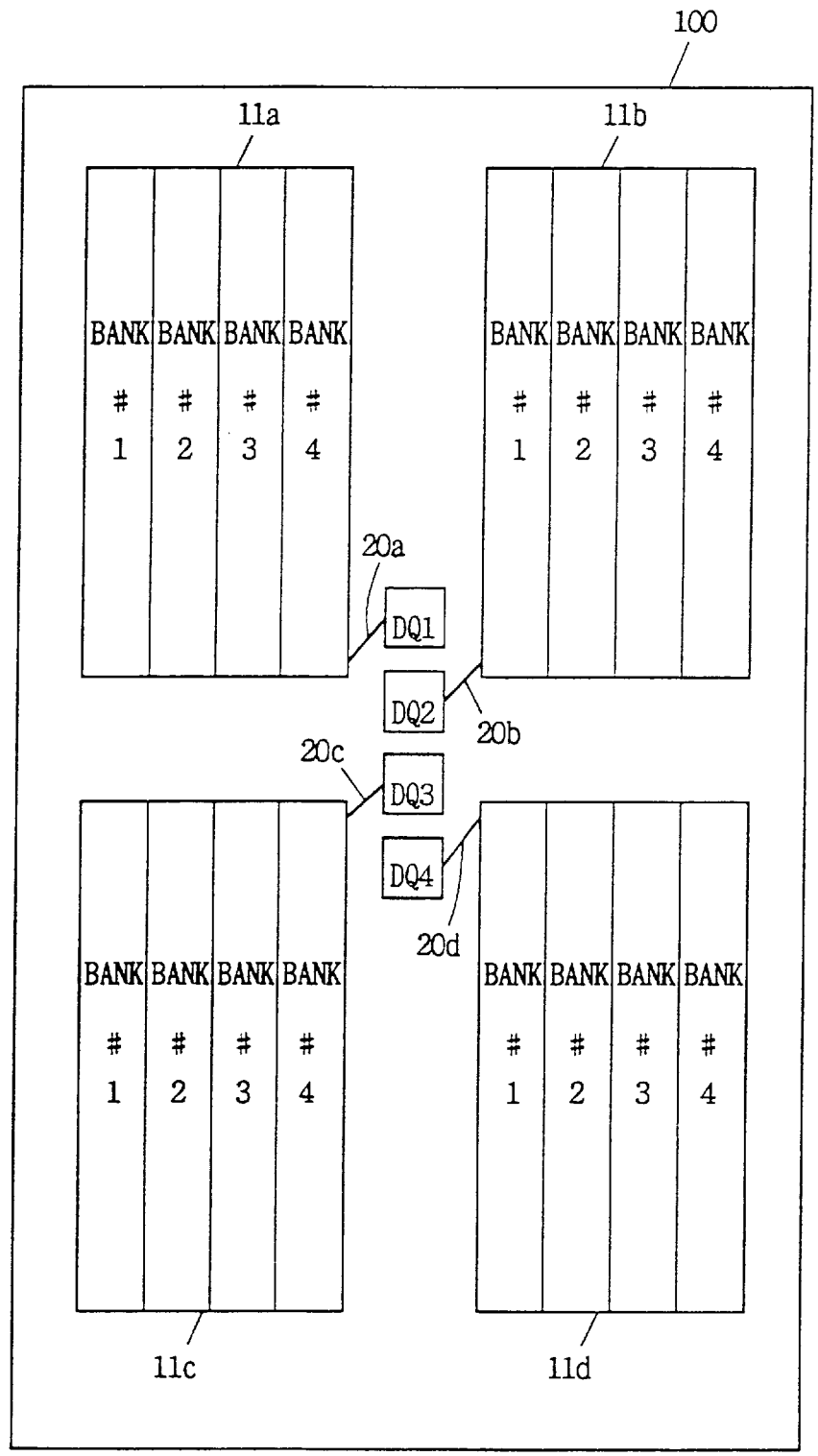
FIG. 6 is a diagram showing how a memory mat and a data input/output terminal are connected in the semiconductor device according to the first embodiment of the present invention.

FIG. 6 schematically shows the bank configuration of an SDRAM 100 having four memory mats 11a–11d. Each of memory mats 11a–11d has a configuration shown in FIG. 1 and includes four banks #1–#4. Memory mats 11a–11d are connected uniquely to DQ pads DQ1–DQ4 through interconnections 20a–20d, respectively. When bank #1 is designated, bank #1 is selected in each of memory mats 11a–11d. The respective memory cell data in the designated bank #1 in memory mats 11a–11d are transmitted to DQ pads DQ1–DQ4, respectively. The same applies to the case where bank #2, #3 or #4 is selected. Therefore, since memory mats 11a–11d are connected to DQ pads DQ1–DQ4 uniquely in a one-to-one correspondence relationship, 4-bit data can be transferred to DQ pads DQ1–DQ4 in parallel, whichever bank is selected. Consequently, only one interconnection line is required between each memory mat and the corresponding DQ pad, avoiding complicated interconnections and increase in area, so that connection between the memory mats and the DQ pads (data input/output terminals) in the bank configuration can be easily implemented.

In this case, increase in number of banks simply leads to increase in number of banks in each of memory mats 11a–11d, with no change in the manner of connection between the memory mats and the DQ pads.

When the readout data has as many as, for example, 8 bits and the number of DQ pads is increased to 8, each of memory mats 11a–11d is simply connected to two DQ pads uniquely. Therefore, in this case as well, one DQ pad (data input/output terminal) is coupled to one memory mat and 2-bit data is read out in parallel from one memory mat, thereby avoiding complicated interconnections and allowing simple arrangement of interconnections connecting the memory mat and DQ pad in the bank configuration.

Further, the subword drivers SR11–SR24 are each shown by an AND gate. In this arrangement, banks on different segments can be driven to a selected state simultaneously. However, if the bank designation signal B1–B4 are generated in a one-shot pulse form, the subword drivers SR11–SR24 are each formed of a latch circuit which enters a through state to pass the signal on the corresponding main word line to the corresponding subword line in response to the activation of the one-shoot pulse, or the bank select signal and enters a latching state to latch the signal and enters a latching state to latch the signal on the corresponding subword line regardless of the signal potential on the corresponding main word line in response to inactivation of the one-shot pulse of the block select signal B1–B4. Such latch circuit can be formed of a transmission gate responsive to the corresponding block select signal, and an inverter buffer latch to pass the signal from the transmission gate on the corresponding subword line as shown in a dotted circle in FIG. 3. By the use of such latch circuit as subword driver, each memory segment 4-i allows multiple selection of different subarrays and of main word lines. The bank select signal may be kept active while the corresponding bank is selected. In this case, the transmission gate is made conductive, and the subword driver maintains the latching state.

The Configuration of a Control Portion

Figure 7:
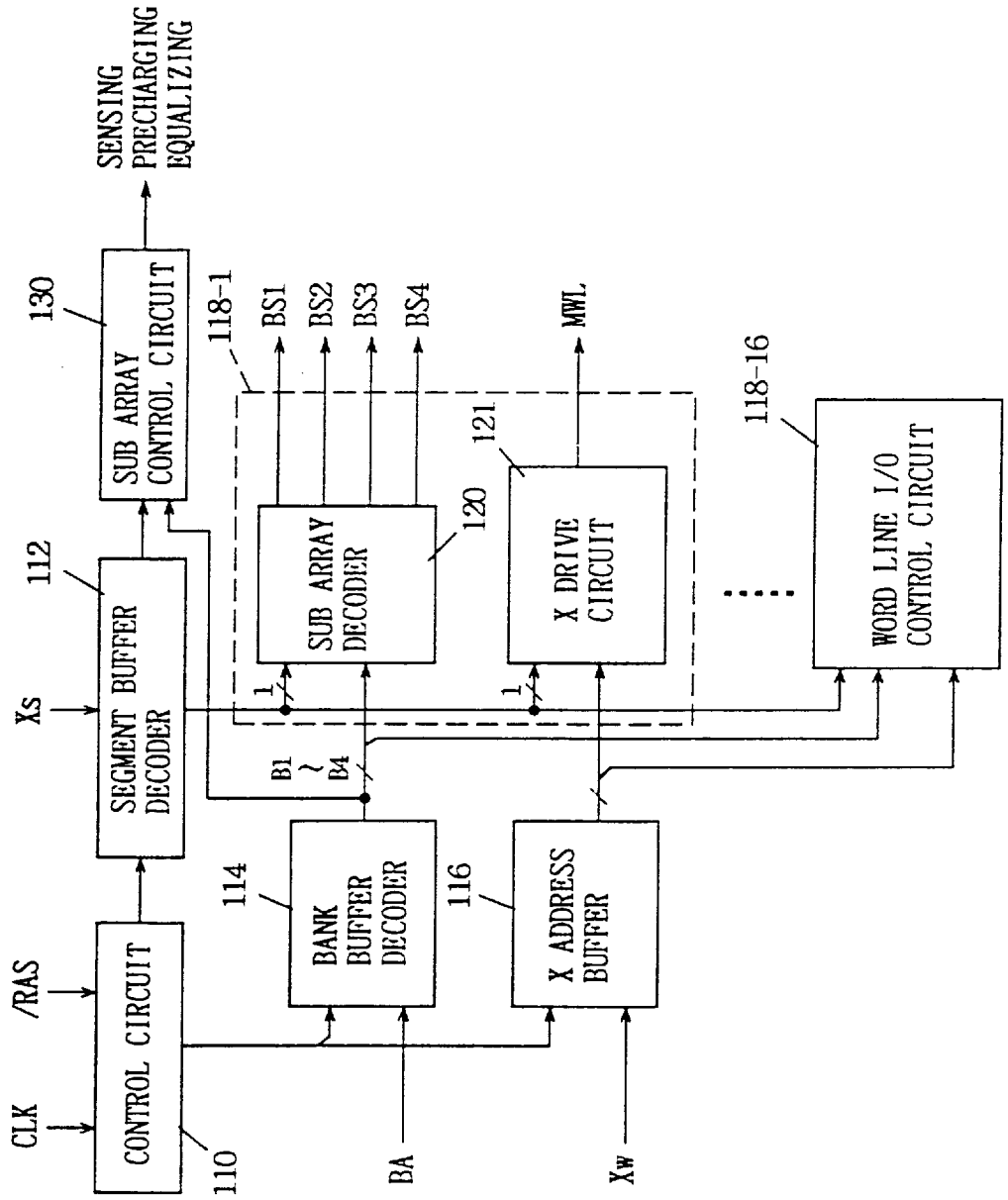
FIG. 7 is a diagram showing a configuration of a control portion in a row selection related circuitry of a semiconductor memory device according to the present invention.

FIG. 7 schematically shows the configuration of a control portion of the SDRAM in accordance with the present invention. FIG. 7 shows the configuration of a portion related to row selection. Referring to FIG. 7, the control portion includes: a control circuit 110 receiving the externally applied clock signal CLK and row address strobe signal /RAS for detecting that a memory access is designated; a bank buffer decoder 114 activated when an output signal of control circuit 110 is activated for incorporating and decoding the externally applied bank address signal BA and outputting bank selection signals B1–B4; a segment buffer decoder 112 activated when the output signal of control circuit 110 is activated for incorporating and decoding the external applied address signal (segment designation address signal) and outputting a segment selection signal designating a memory segment; an X address buffer 116 activated when the output signal of control circuit 110 is activated for incorporating an externally applied address signal Xw for word line designation and outputting an internal X address signal; word line IO control circuits 118-1 to 118-16 provided corresponding to memory segments 4-1 to 4-16 (see FIG. 1) for outputting sub array selection signals BS1–BS4 and the row selection signal (MWL) in accordance with the output signals of segment buffer decoder 112, bank buffer decoder 114 and X address buffer 116; and a sub array control circuit 130 for controlling the sensing, bit line precharging/equalizing and connection between the bit line and the sense amplifier and activation of the sense amplifier in the sub array in accordance with segment designation signal output from segment buffer decoder 112 and the bank designation signal from bank buffer decoder 114.

Control circuit 110 outputs an access designation signal when clock signal CLK rises and signal /RAS is at a low level. The access designation signal corresponds to an internal RAS signal in the standard DRAM. An address signal Xs applied to segment buffer decoder 112 designates one memory segment out of 16 memory segments. That is, address signal Xs is formed by, for example, 4-bit address signal. Segment buffer decoder 112 decodes segment address signal Xs and outputs the segment designation signal for activating one memory segment of 16 memory segments 4-1 to 4-16. Bank buffer decoder 114 receives bank address BA and activates one of bank designation signals B1–B4 designating one of the four banks if four banks are provided.

Sub array control circuit 130 designates the end of bit line precharging/equalizing, activation of the sense amplifier, and the connection between the sense amplifier and the bit line for the bank designated by bank buffer decoder 114, i.e. the selected sub array, in the memory segment designated by segment buffer decoder 112. In the non-selected sub array, the sense amplifier maintains an inactive state and each bit line is precharged/equalized at a prescribed potential. Sub array control circuit 130 outputs the control signal shown in FIG. 4, and can be configured to also give a timing at which row selection signal MWL is activated (activation timing of row decoder 2a).

Word line IO control circuits 118-1 to 118-16 includes a sub array decoder 120 activated when the segment designation signal from segment buffer decoder 112 is activated for receiving bank selection signals B1–B4 from bank buffer decoder 114 and activating any of sub array selection signals BS1–BS4 in the corresponding memory segment; and an X drive circuit 121 for receiving and decoding the segment designation signal from segment buffer decoder 112 and X address signal Xw from X address buffer 116 and outputting row selection signal MWL to the corresponding row. X drive circuit 121 forms the portion of the row decoder and the word line driver illustrated in FIG. 1. X drive circuit 121 is activated when segment buffer decoder 112 designates the corresponding memory segment, and decodes address signal Xw from X address buffer 116 and outputs the row selection signal for the row of the corresponding memory segment. In accordance with row selection signal MWL output from X drive circuit 121 and bank selection signals B1–B4 from bank buffer decoder 114, sub word line drive gate SR shown in FIG. 3 is selectively activated/inactivated (or entered into through/latch state) and the sub word line in the selected sub array is selected.

Sub array decoder 120 outputs signals BS1–BS4 for controlling connection between the global IO bus and local IO bus. In this case, sub array decoder 120 can be configured such that activation timing of output signals BS1–BS4 are determined in accordance with the timing of signal /CAS described later.

Figure 8:
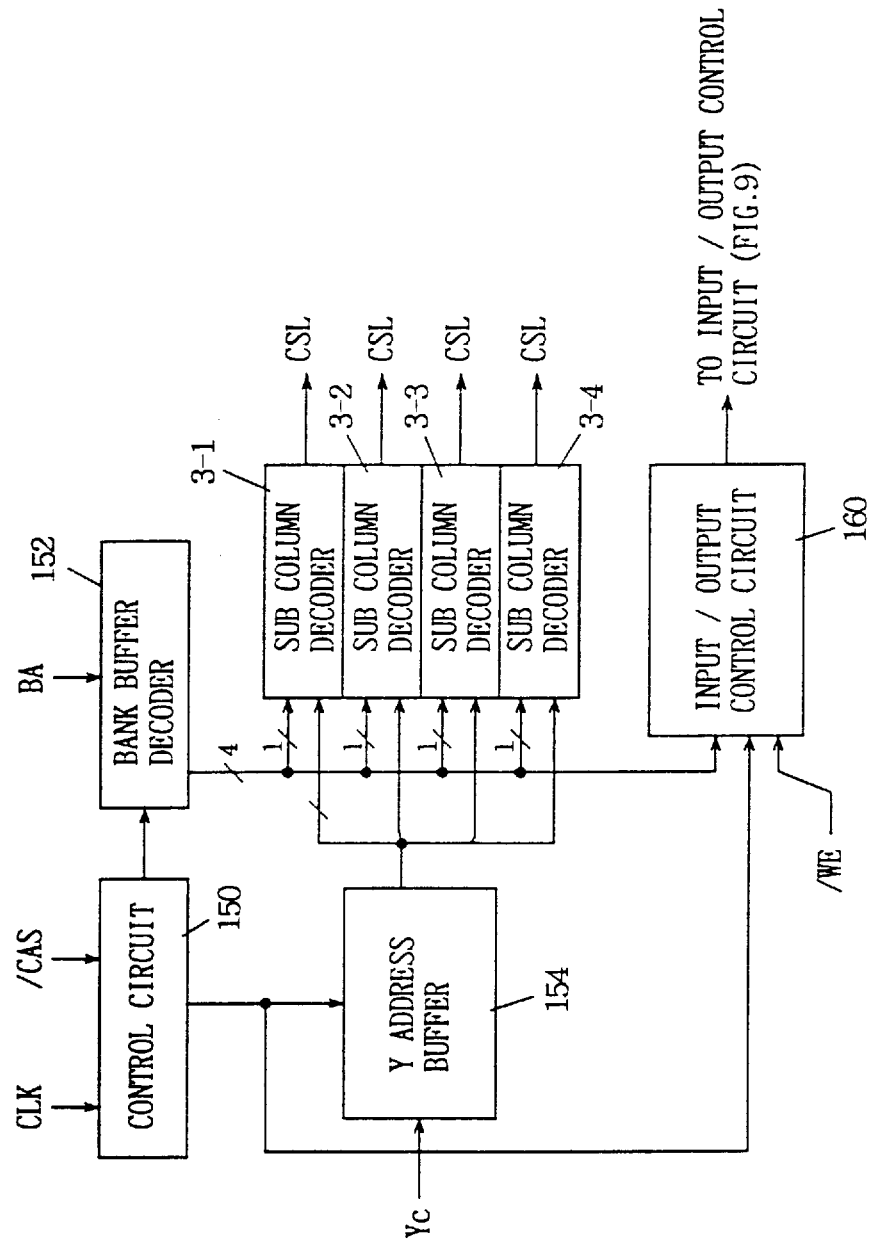
FIG. 8 is a diagram schematically showing a configuration of a control portion in a column selection related circuitry of a synchronous semiconductor memory device according to the present invention.

FIG. 8 shows the configuration of the part of a control portion related to the column selection. Referring to FIG. 8, the column selection control portion includes a control circuit 150 for receiving clock signal CLK and column address strobe signal /CAS, a bank buffer decoder 152 for incorporating and decoding externally applied bank address BA in response to an output signal of control circuit 150, a Y address buffer 154 responsive to the output signal of control circuit 150 for incorporating an externally applied address signal Yc and outputting an internal Y address signal, and an input/output control circuit 160 responsive to the output signals of bank buffer decoder 152 and control circuit 150 for controlling data input/output operation (data transfer between the data input/output terminal and the internal circuit). The output signals of bank buffer decoder 152 and Y address buffer 154 are applied to sub column decoders 3-1 to 3-4.

When clock signal CLK rises and column address strobe signal /CAS is at a low level, control circuit 150 determines that the column selection operation is designated and activates bank buffer decoder 152 and Y address buffer 154. Bank buffer decoder 152, when activated, decodes bank address signal BA and outputs a signal designating the corresponding bank, thereby activating any of sub column decoders 3-1 to 3-4. The sub column decoder provided corresponding to the selected bank is activated in accordance with the output signal of bank buffer decoder 152 and decodes the internal Y address signal from Y address buffer 154, thereby selecting one of the corresponding 256 column selection lines.

Figure 9:
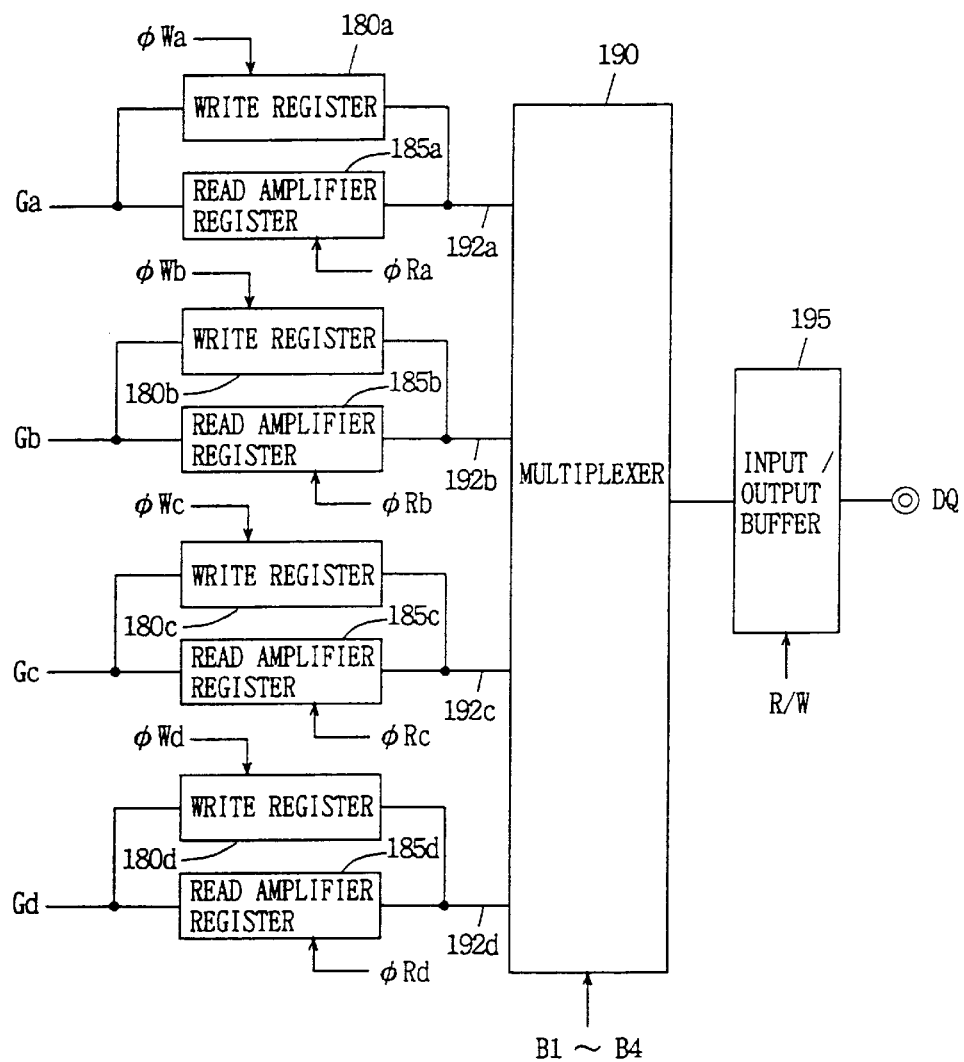
FIG. 9 is a diagram schematically showing a configuration of a data input/output portion of a synchronous semiconductor memory device according to the present invention.

Input/output control circuit 160 determines whether data is input or output in accordance with combination of the output signal of control circuit 150 and write enable signal /WE, and determines the bank on which data input/output operation is performed in accordance with the bank designation signal of bank buffer decoder 152, thereby controlling operation of the input/output circuit shown in FIG. 9 in accordance with the determined result so that data is transferred between the selected bank and the data input/output terminal.

The bank designation signal output from bank buffer decoder 152 can be applied to sub array decoder 120 shown in FIG. 7 in place of the output of bank buffer decoder 114.

By utilizing such configuration of the control portion shown in FIGS. 7 and 8, data input/output operation can be surely performed on the selected bank even if a plurality of banks are provided in one memory mat.

The Configuration of the Input/Output Portion

FIG. 9 shows the configuration of the data input/output portion of the SDRAM in accordance with the present invention. Operation of the data input/output portion illustrated in FIG. 9 is controlled in accordance with the control signals from input/output control circuit 160 shown in FIG. 8. Referring to FIG. 9, the input/output portions are provided corresponding to global IO buses Ga–Gd and include write registers 180a–180d for storing and transmitting write data to the corresponding global IO lines Ga–Gd at a prescribed timing upon data writing, read amplifier registers 185a–185d for amplifying and storing data applied from global IO lines Ga–Gd and outputting the data at the prescribed timing upon data readout, a multiplexer 190 for selecting any of internal signal lines 192a–192d in accordance with the bank selection signal, and an input/output buffer 195 provided between multiplexer 190 and data input/output terminal DQ.

Write register 180a and read amplifier register 185a are connected in parallel to each other between internal signal line 192a and global IO bus Ga. Write register 180b and read amplifier register 185b are connected in parallel to each other between internal signal line 192b and global IO bus Gb. Between internal signal line 192c and global IO bus Gc, write register 180c and read amplifier register 185c are connected in parallel to each other. Between internal signal line 192d and global IO bus Gd, write register 180d and read amplifier register 185d are connected in parallel to each other.

Write registers 185a–185d are activated in accordance with write control signal φWa–φWd output from input/output control circuit 160 shown in FIG. 8, store data applied from multiplexer 190 and transmit the data onto the corresponding global IO bus Ga–Gd at a prescribed timing, respectively. Read amplifier registers 185a–185d are activated in accordance with readout control signals φRa–φRd from input/output control circuit 160 shown in FIG. 8, and amplify and latch data on the corresponding global IO buses Ga–Gd, respectively. Read amplifier registers 185a–185d transmit the stored data to the corresponding internal signal lines 192a–192d in accordance with readout control signals φRa–φRd. Although control signals φWa–φWd are each formed by a plurality of control signals to designate the timing to latch data and the timing to transmit the data to the corresponding global IO bus, they are each shown as one control signal for the sake of simplicity. The same applies to readout control signals φRa–φRd: although signals φRa–φRd designate the timing to amplify and latch data on the corresponding global IO buses Ga–Gd in read amplifier registers 185a–185d and to output the latched data and therefore include a plurality of control signals, each of them is shown as one control signal for simplicity.

In accordance with bank selection signals B1–B4, multiplexer 190 selects the internal signal line corresponding to the bank designated by the bank selection signal to be connected to input/output buffer 195. Input/output buffer 195 performs data input/output (transfer) between data input/output terminal DQ and multiplexer 190 in accordance with read/write indication signal R/W which in turn is rendered active in synchronization with external clock signal CLK.

The configuration shown in FIG. 9 is provided for one memory mat. As shown in FIG. 1, one configuration shown in FIG. 9 is provided for each memory mat if four memory mats are provided and 4-bit data is input/output.

As described above, in accordance with the first embodiment of the present invention, each memory mat is configured to have a plurality of banks in an SDRAM with multi-bank and multi-DQ, so that a DQ terminal connected to one memory mat is determined uniquely, to avoid a situation where a plurality of data input/output terminals (DQ terminals) are connected to the data input/output lines from a plurality of memory mats, whereby layout of interconnection is made simpler and interconnection capacitance for one data input/output pad is reduced, thereby allowing fast input/output of data.

Embodiment 2

FIG. 10 schematically shows a configuration of an array portion in an SDRAM according to a second embodiment of the present invention. In FIG. 10, a configuration of a portion related to two rows of main word lines in one memory mat is schematically shown. Referring to FIG. 10, banks #1–#4 are each divided further into two column groups #A and #B. Sub word lines SWLa and SWLb are disposed corresponding to respective column groups. In FIG. 10, the sub word line included in column group #A of bank #i (i=1-4) is indicated by a character SWLaji and the sub word line included in column group #B of bank #i by a character SWLbji. Here, j indicates the position of the corresponding main word line, which is indicated as MWLj. A sub word line drive gate SRaji is arranged at an intersection of main word line MWLj and sub word line SWLaji, while a sub word line drive gate SRbji is arranged at an intersection of sub word line SWLbji and main word line MWLj.

Sub word line drive gate SRaji receives a bank/column group selection signal Bia, and sub word line drive gate SRbji receives a bank/column group selection signal Bib.

Sub word line drive gate SRaji is indicated as an AND gate. However, the gate may be joined by a latch circuit indicated in a dotted circle, wherein one-shot pulse from bank select signal Bia (Bib) is generated and the latch enters into the through state to drive a corresponding sub word line in accordance with a signal potential on a corresponding main word line. Such arrangement allows a multiple section of memory sub arrays in the same memory segment.

By thus further dividing the sub word line, a smaller number of memory cells are connected to one word line, so that the parasitic capacitance of the word line is reduced and therefore the word line is driven to the selected state at a high speed. If the number of sub word lines selected simultaneously is made changeable, change in specification of the refresh cycle can be easily coped with.

Figure 11A:
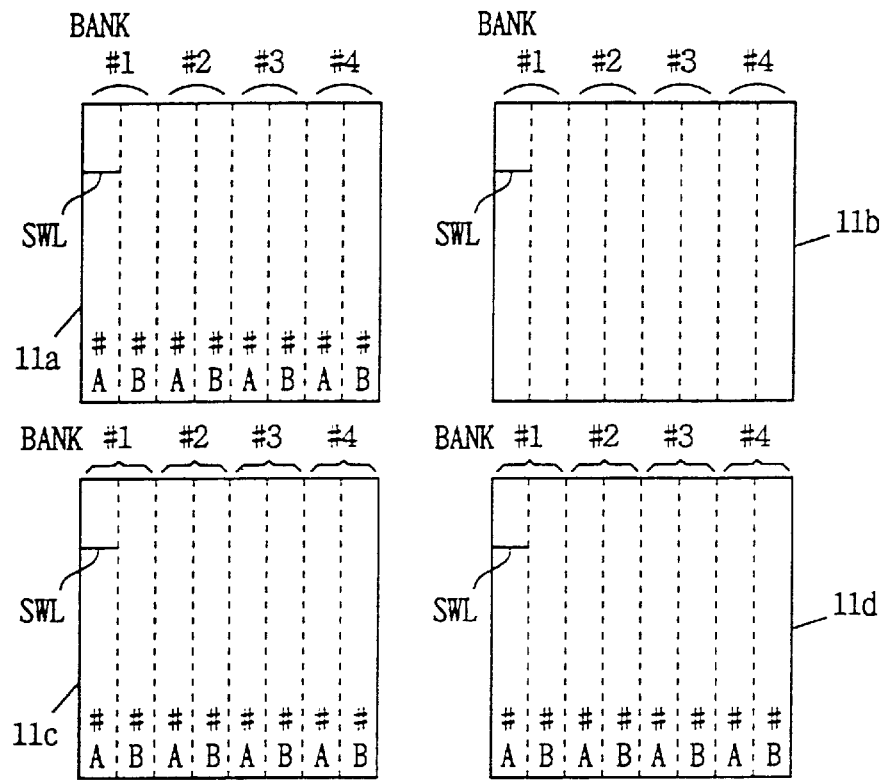
FIGS. 11A and 11B illustrate how word lines are selected in the second embodiment.
Figure 11B:
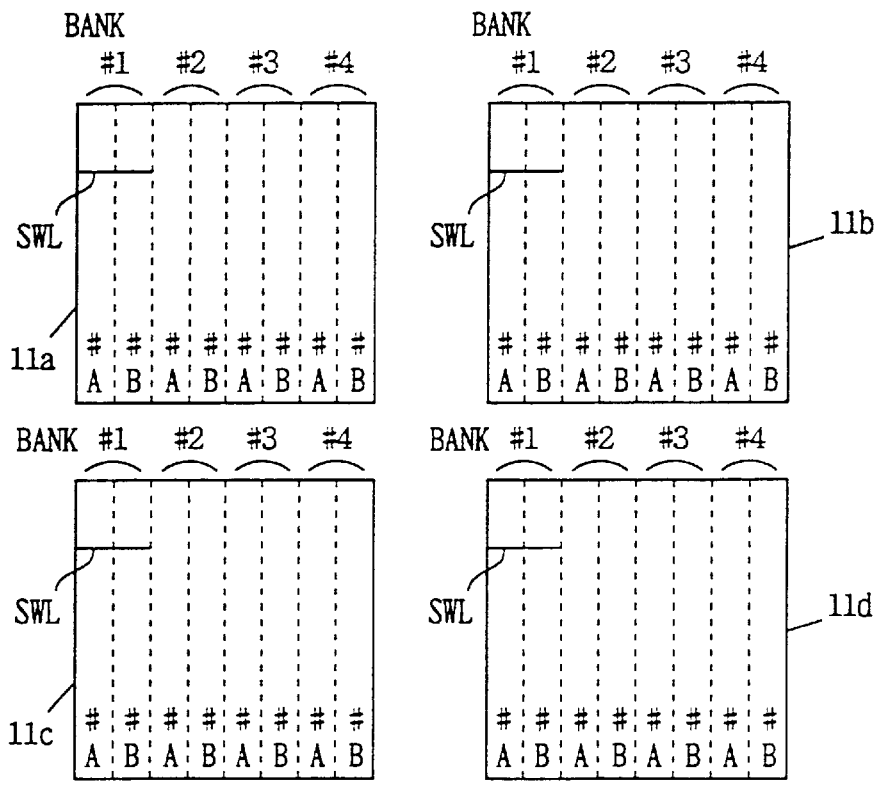

FIGS. 11A and 11B show exemplary manner of selecting the sub word line in the arrangement of arrays shown in FIG. 10. In FIGS. 11A and 11B, four memory mats 11a–11d are shown. Referring to FIG. 11A, sub word line SWL is selected in column group #A of bank #1 in each of memory mats 11a–11d. In other words, a sub word line is selected in each column group in the configuration shown in FIG. 11A. In this case, the number of word lines selected at one time is reduced equivalently. Therefore, the refresh cycle is greater with the configuration shown in FIG. 11A. In the configuration shown in FIG. 11B, the sub word lines in column groups #A and #B of bank #1 are selected simultaneously. In this case, the sub word line is selected on a bank-by-bank basis. Therefore, with the configuration for selecting the sub word line shown in FIG. 11B, more sub word lines are selected at a time and therefore the refresh cycle is reduced to ½ as compared to the sub word line selection configuration shown in FIG. 11A.

By thus dividing columns in the memory array (memory mat) into groups of an integral multiple of the number of banks, the load capacitance of the sub word line is reduced and the word line can be selected at a high speed, thereby easily coping with the change in refresh cycle.

Arrangement of Local IO Bus

Figure 12:
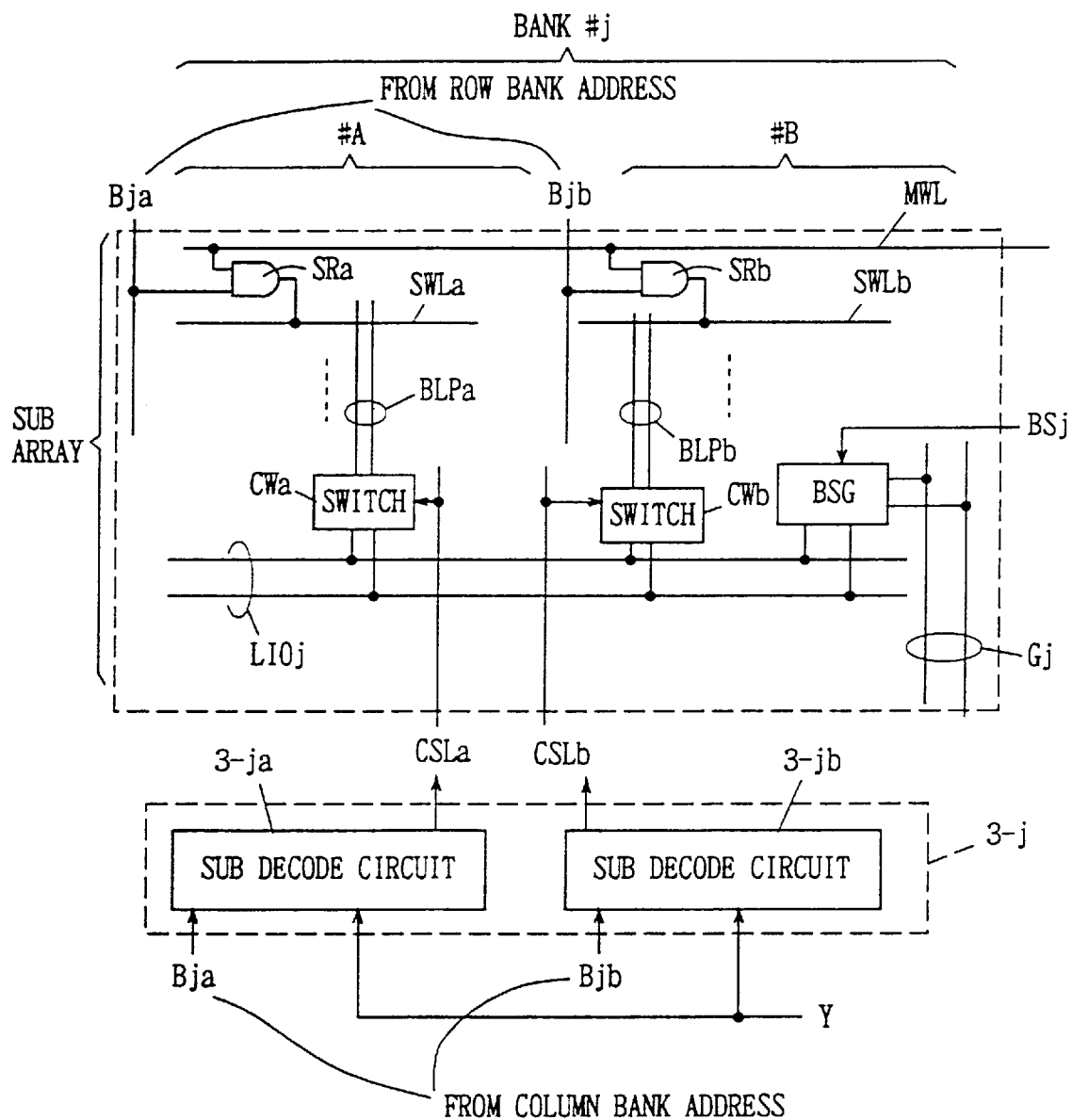
FIG. 12 is a diagram schematically showing an arrangement of a local IO bus and a global IO bus according to the second embodiment of the present invention.

FIG. 12 shows an arrangement of the Local IO bus in the arrangement of the array shown in FIG. 10. In FIG. 12, an arrangement of local IO bus LIOj for one sub array in one bank #j is shown. Referring to FIG. 12, bank #j is divided into two column groups #A and #B, and sub word lines SWLa and SWLb are disposed for respective column groups #A and #B. Main word line MWL is disposed common to sub word lines SWLa and SWLb. Corresponding to main word line MWL and sub word line SWLa, a sub word line drive gate SRa is arranged which is enabled in response to a bank selection signal Bja. Corresponding to main word line MWL and sub word line SWLb, a sub word line drive gate SRb is arranged which is enabled in response to a bank selection signal Bjb.

FIG. 12 representatively shows bit line pairs BLPa and BLPb arranged to cross sub word lines SWLa and SWLb, respectively. Local IO bus LIOj is disposed common to column groups #A and #B. Local IO bus LIOj is coupled to bit line pair BLPa through a column selection switch CWa in column group #A, and is coupled to bit line pair BLPb through a column selection switch CWb in column group #B.

Local IO bus LIOj is coupled to global IO bus Gj (any of Ga–Gd) through block selection gate BSG which is rendered conductive in response to a sub array selection signal BSj.

Sub column decoder 3-j is also divided into sub decode circuits 3-ja and 3-jb corresponding to respective column groups #A and #B. Sub decode circuit 3-ja is enabled in response to bank selection signal Bja, decodes a column address signal Y and outputs column selection signal CSLa. Sub decode circuit 3-jb is enabled in response to bank selection signal Bjb, decodes column address signal Y and outputs a column selection signal CSLb. That is, sub decode circuit 3-ja operates to select a column in column group #A, while sub decode circuit 3-jb operates to select a column in column group #B. Bank selection signals Bja and Bjb applied to sub column decoder 3-j are produced from column bank address (applied at the same time as signal /CAS) BA. In this case, the total number of bits of column bank address BA and column address signal Y is constant, and the number of bits of column address signal Y is increased or decreased and accordingly the number of bits of column bank address BA is decreased or increased depending on whether or not the sub word lines are selected simultaneously in the bank. Now, operation will be described briefly.

When a sub word line is selected with a column group as one unit as shown in FIG. 11A, one of bank selection signals Bja and Bjb attains an active state and the other attains an inactive state when bank #j is designated. Assuming that column group #A is designated, the word line selection signal on main word line MWL is transmitted to sub word line SWLa through sub word line drive gate SRa. In sub column decoder 3-j, sub decode circuit 3-ja is enabled in response to bank selection signal Bja, decodes column address signal Y and transmits column selection signal CSLa onto the column selection line. As a result, the column selection switch (transmission gates 8 and 9) is rendered conductive, whereby the corresponding bit line pair BLPa is connected to local IO bus LIOj. Meanwhile, sub decode circuit 3-jb is in an inactive state with bank selection signal Bjb in a non-selected state and the column selection operation is not performed. Thus, the column selection operation in column group #B is not performed. Next, block selection gate BSG is rendered conductive in accordance with sub array selection signal BSj and local IO bus LIOj and global IO bus Ga are connected with each other. As a result, data can be transferred between bit line pair BLPa and global IO bus Ga through local IO bus LIOj.

If the sub word line is selected on a bank-by-bank basis as shown in FIG. 11B, bank selection signals Bja and Bjb both attain an active state and sub word line drive gates SRa and SRb are both enabled when bank #A is designated. In this case, the word line selection signal on main word line MWL is transmitted onto sub word lines SWLa and SWLb.

In sub column decoder 3-j, both sub decode circuits 3-ja and 3-jb are enabled to decode column address signal Y because block selection signals Bja and Bjb both indicate the selective state. When the sub word line is driven on a bank-by-bank basis, the number of bits of the column bank address is reduced by 1 bit, and therefore the number of bits of column address signal Y is increased by 1 bit (as compared to the configuration for driving the sub word line with a column group as one unit). Therefore, this address signal Y selects one column from column groups #A and #B. As a result, the column selection signal is output from one of sub decode circuits 3-ja and 3-jb. Assuming that column selection signal CSLb attains an active state, column selection switch CWb is rendered conductive, thereby connecting the corresponding bit line pair BLPb to local IO bus LIOj. Subsequently or simultaneously, sub array selection signal BSj attains an active state and block selection gate BSG is rendered conductive, thereby connecting local IO bus LIOj with global IO bus Ga. Thus, data is transferred between bit line pair BLPb and global IO bus Ga.

As illustrated in FIG. 12, data can be read/written accurately by performing the column selection operation for respective column groups even if the local IO bus is arranged in common to a plurality of column groups (two groups in FIG. 12) in the entire bank. Since this can be achieved by properly adjusting the number of bits of the bank address signal and the signal for row designation in the row address signal and properly adjusting the number of bits of the column bank address signal and Y address signal designating the column in the column address signal, the manner of driving the sub word lines in an array can be easily changed.

Arrangement of Local IO Bus 2

Figure 13:
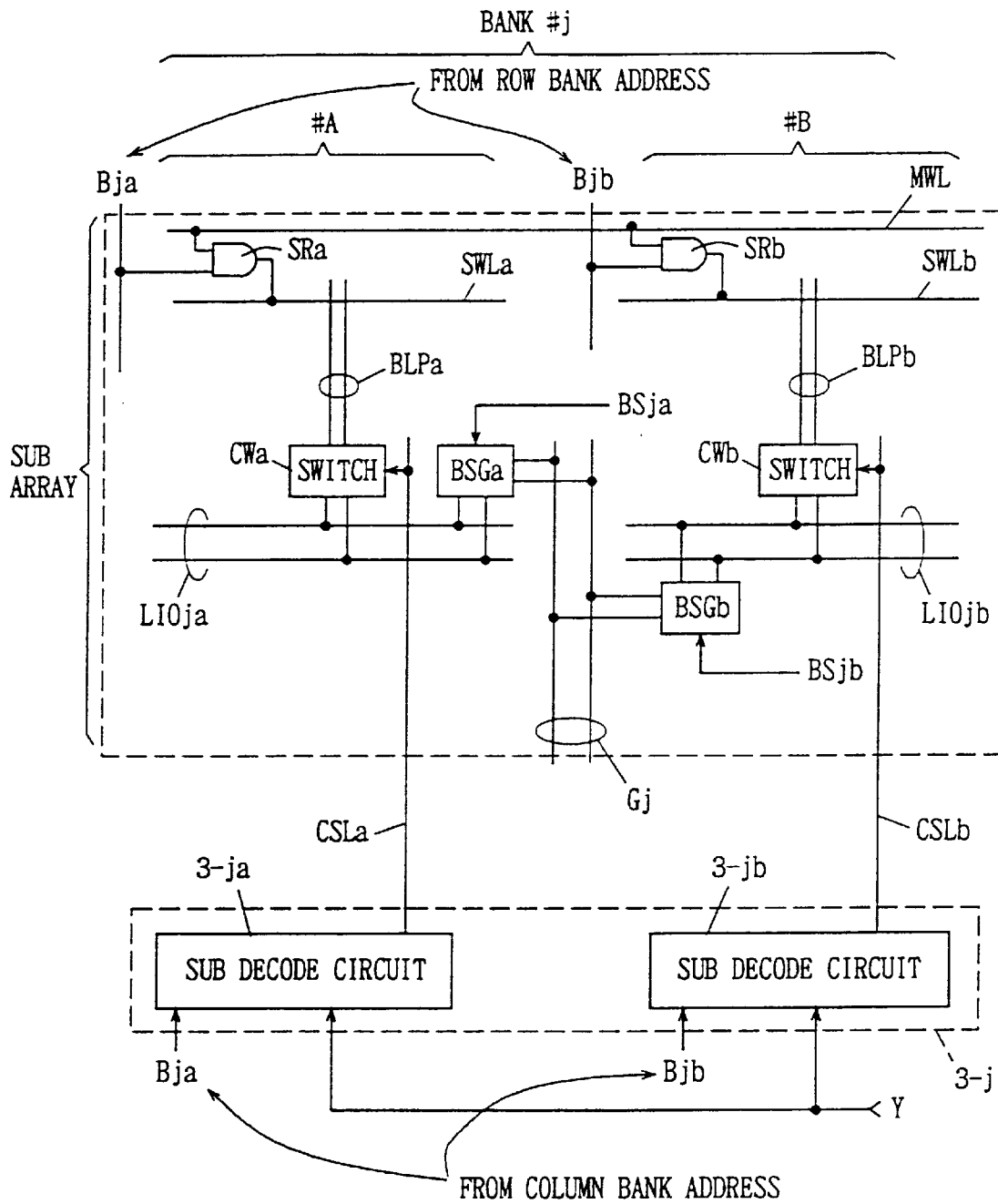
FIG. 13 is a diagram schematically showing another arrangement of a local IO bus and a global IO bus in the second embodiment of the present invention.

FIG. 13 shows a second arrangement of the local IO bus. In FIG. 13, the arrangement of the local IO bus for one sub array is shown. In contrast to the configuration shown in FIG. 12, local IO buses LIOja and LIOjb are provided for column groups #A and #B, respectively, in the configuration shown in FIG. 13. Global IO bus Gj is disposed common to these local IO buses LIOja and LIOjb.

The arrangement of the array in the column group, i.e. the main word line, the sub word line and the bit line pair, is the same as that in the configuration shown in FIG. 12, and thus the corresponding portions are labeled with the identical reference numerals. Local IO bus LIOja is connected to global IO bus Gj through a block selection gate BSGa. Local IO bus LIOjb is connected to global IO bus Gj through a block selection gate BSGb. Block selection gate BSGa is rendered conductive in response to a selection signal BSja, and block selection gate BSGb is rendered conductive in response to a selection signal BSjb. These selection signals BSja and BSjb are produced by the memory segment designation signal (see the segment buffer decoder in FIG. 7) and the row bank address (the bank address applied when signal /RAS is activated; or bank selection signals Bja and Bjb).

The configuration of sub column decoder 3-j is identical to that shown in FIG. 12: sub decode circuit 3-ja is provided for column group #A and sub decode circuit 3-jb is provided for column group #B. Sub decode circuit 3-ja is activated in response to bank designation signal Bja produced from the column bank address, while sub decode circuit 3-jb is activated in accordance with bank designation signal Bjb produced from the column bank address. The configuration and operation of sub column decoder 3-j are identical to those of the sub column decoder shown in FIG. 12.

A brief description will be made first of operation when the sub word line is driven with a column group as one unit. Assuming that column group #A is. designated, bank selection signal Bja produced from the row bank address attains an active state, while a bank selection signal Bjb maintains the non-selected state. Therefore, sub word line SWLa is driven to the selected state through sub word line drive gate SRa, and sub word line SWLb maintains the non-selected state. Next, in sub column decoder 3-j, column selection signal CSLa from sub decode circuit 3-ja attains an active state, and column selection switch CWa is rendered conductive, thereby connecting bit line pair BLPa to local IO bus LIOjb. Subsequently or simultaneously, selection signal BSja attains an active state and block selection gate BSGa is rendered conductive, thereby connecting local IO bus LIOja to global IO bus Ga. Selection signal BSjb maintains the non-selected state and block selection gate BSGb maintains the non-conductive state. As a result, local IO bus LIOjb is isolated from global IO bus Ga. Only the local IO bus (LIOja) provided for the column group including the selected memory cell (column group #A) is connected to global IO bus Ga.

If the word line is driven on a bank-by-bank basis, bank selection signals Bja and Bjb both attain an active state. In such a case, sub word lines SWLa and SWLb are both driven to the selected state through sub word line drive gates SRa and SRb. In sub column decoder 3-j, one column in this sub array (column group #A) is selected. Therefore, a column selection signal (for example, CSLb) from one of sub decode circuits 3-ja and 3-jb attains an active state. As a result, bit line pair BLPb corresponding to the activated column selection signal CSLb is connected to local IO bus LIOjb through column selection switch CWb. When an access is made on a bank-by-bank basis, selection signals BSja and BSjb both attain an active state, so that local IO buses LIOja and LIOjb are connected to global IO bus Ga through block selection gates BSGa and BSGb. Since the data of the selected memory cell is not transmitted to local IO bus LIOja, data can be accurately transferred between bit line pair BLPb and global IO bus Gj.

In driving the word lines on a bank-by-bank basis, an alternative configuration where one of selection signals BSja and BSjb is selected (activated) can be adopted. In driving the sub word line on a bank-by-bank basis, the configuration in which only one of the local IO buses is connected to the global IO bus can be easily implemented by designating one of column groups #A and #B using 1 bit of column address signal Y.

In the arrangement shown in FIG. 13, global IO bus Gj is disposed common to column groups #A and #B. However, an alternative configuration can be employed where the global IO buses are provided separately for column groups #A and #B and one global IO bus provided corresponding to a selected column group is selected in accordance with the column group selection signal and connected to the read/ write circuit.

As illustrated in FIG. 13, if a local IO bus is provided for each column group and only the local IO bus provided for the column group including the selected memory cell is connected to the global IO bus, the load capacitance of the local IO bus connected to the global IO bus is diminished, thereby allowing reading/writing of data at a high speed.

As described above, in accordance with the second embodiment, columns are divided into groups of an integral multiple of the number of banks in the memory array, so that the sub word lines can be selectively driven in accordance with the number of refresh cycle, thereby allowing implementation of multiple kinds of SDRAMs with one chip configuration.

Embodiment 3

Figure 14:
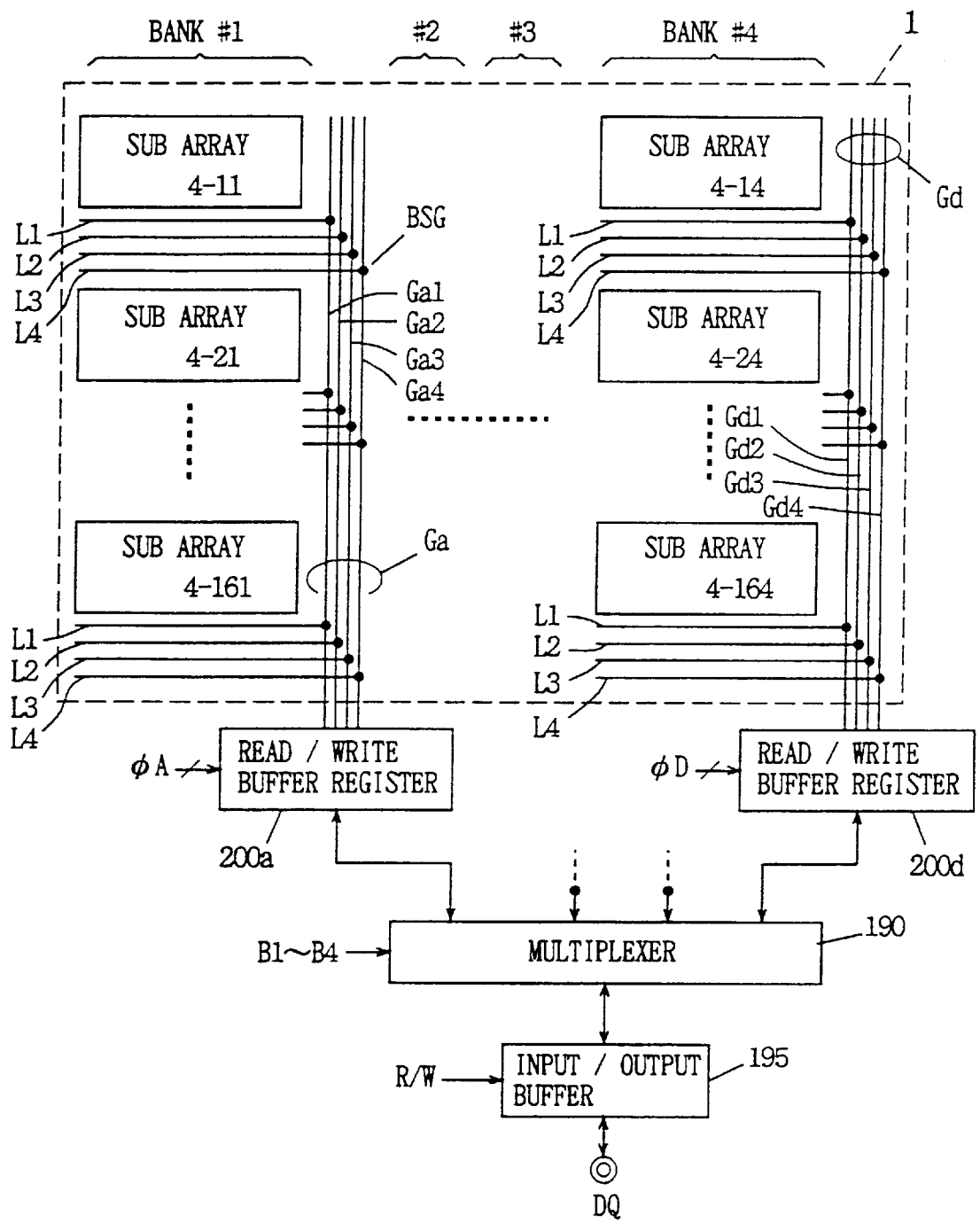
FIG. 14 is a diagram schematically showing a configuration of a main part of a synchronous semiconductor memory device according to a third embodiment of the present invention.

FIG. 14 shows a configuration of a main part of an SDRAM according to a third embodiment of the present invention. In FIG. 14, the configuration of an array portion of one memory mat is illustrated. Referring to FIG. 14, memory array 1 is divided into four banks #1–#4. Four local IO buses L1–L4 are arranged for each of sub arrays 4-11 to 4-161 included in bank #1. Four global IO buses Ga1–Ga4 are disposed common to sub arrays 4-11 to 4-161. Global IO buses Ga1–Ga4 are coupled to four local IO buses L1–L4 provided in each of sub arrays 4-11 to 4-161 through block selection gates BSG.

Four local IO buses L1–L4 are disposed also for each of sub arrays 4-14 to 4-164 included in bank #4. Global IO buses Gd1-Gd4 are disposed common to sub arrays 4-14 to 4-164. In bank #4 as well, four local IO buses L1–L4 provided in each of sub arrays 4-14 to 4-164 are connected in common to the corresponding global IO buses Gd1–Gd4.

Global IO bus Ga with a 4-bit width is coupled to a read/write buffer register 200a, and global IO bus Gd with a 4 bit width is coupled to a read/write buffer register 200d. The remaining banks #2 and #3 which are not shown also have the similar configuration.

Read/write buffer registers 200a and 200d are coupled in common to multiplexer 190. Multiplexer 190 connects input/output buffer 195 with one of read/write buffer registers 200a–200d which corresponds to the selected bank in accordance with bank selection signals B1–B4. Signal R/W applied to input/output buffer 195 is a read/write introduction signal which changes in synchronization with clock signal CLK not shown, and in accordance with this signal R/W data is input/output in synchronization with clock signal CLK.

Read/write buffer registers 200a–200d can communicate data through respective global IO buses Ga–Gd each with a 4-bit width in parallel to each other, each buffer register including a register of a 4-bit width for readout data and a buffer register of a 4-bit width for storing write data. Read/write buffer registers 200a–200d input/output data in accordance with operation control signals φA–φD, respectively.

Upon data readout, one sub array (for example, 4-11) is selected in the selected bank (for example, #1). In the selected sub array, 4-bit memory cells are selected and connected simultaneously to local IO buses L1–L4. Next, 4-bit local IO bus L1–L4 provided corresponding to the selected sub array (sub array 4-11) is connected to global IO bus Ga (Ga1–Ga4) with a 4-bit width through block selection gates BSG. The 4-bit data read out to 4-bit global IO bus Ga1–Ga4 is stored in the read/write buffer register (200a) provided corresponding to the selected bank in accordance with the operation control signal (φA). Multiplexer 190 connects input/output buffer 195 with the register (200a) corresponding to the selected bank in accordance with bank selection signals B1–B4. In accordance with operation control signal φA and read/write control signal R/W, the data bits stored in the read/write buffer register (200a) provided corresponding to the selected bank are sequentially output to data input/output terminal DQ in synchronization with clock signal CLK (signal R/W).

Upon data writing, multiplexer 190 selects the read/write buffer register corresponding to the selected bank in accordance with bank selection signals B1–B4. Assuming that bank #1 is designated, multiplexer 190 selects read/write buffer register 200a and connects the selected buffer 200a to input/output buffer 195. In synchronization with read/write control signal R/W, the write data applied to data input/output terminal DQ is stored in read/write buffer 200a through input/output buffer 195 and multiplexer 190. In the selected bank #1, the sub array attains an active state and row selection is carried out. As an example, assuming that the write data is all stored in read/write buffer register 200a through input/output buffer 195, the 4-bit data is transferred to local IO buses L1–L4 provided for the selected sub array 4-11, and data on local IO buses L1–L4 is transferred to 4-bit memory cells selected in sub array 4-11. Data can be written simultaneously from read/write buffer register 200a to 4 bit memory cells in the selected sub array 4-11 or can be transferred sequentially in synchronization with clock signal CLK or sequentially transferred with 2 bits at a time.

As shown in FIG. 14, the global IO bus with a plural-bit width and the local IO bus with a plural-bit width are disposed for each bank, so that, upon data readout, data of the selected memory cell is transferred beforehand (prefetched) from the selected sub array to the read/write buffer register and the data can be read out sequentially through input/output buffer 195 in synchronization with the clock signal. If selection is made on a bit-by-bit basis in the selected sub array in synchronization with the clock signal in, for example, a nibble mode, 1-bit data is transferred to the input/output buffer through the local IO line and the global IO line, whereby a long period of time is required for data transfer and data cannot be input/output at a high speed. However, if the read/write buffer registers 200a–200d with a plural bit width are provided, data can input/output at a high speed in synchronization with the clock signal. In parallel to selection of the sub array and selection of the row and column of the memory cells, write data can be sequentially stored in the buffer register and transferred from the buffer register to the selected memory cell. Upon read out, although a time is required from selection of the memory cell to the data transfer into the read/write buffer register, data can be read out at a high speed thereafter.

The local IO bus and the global IO bus shown in FIG. 14 may have, for example, 8 bits or 16 bits. The bit width of local. IO bus and global IO bus is determined by the number of bits stored in read/write buffer registers 200a–200d.

Alternative Arrangement of the Bus 1

Figure 15:
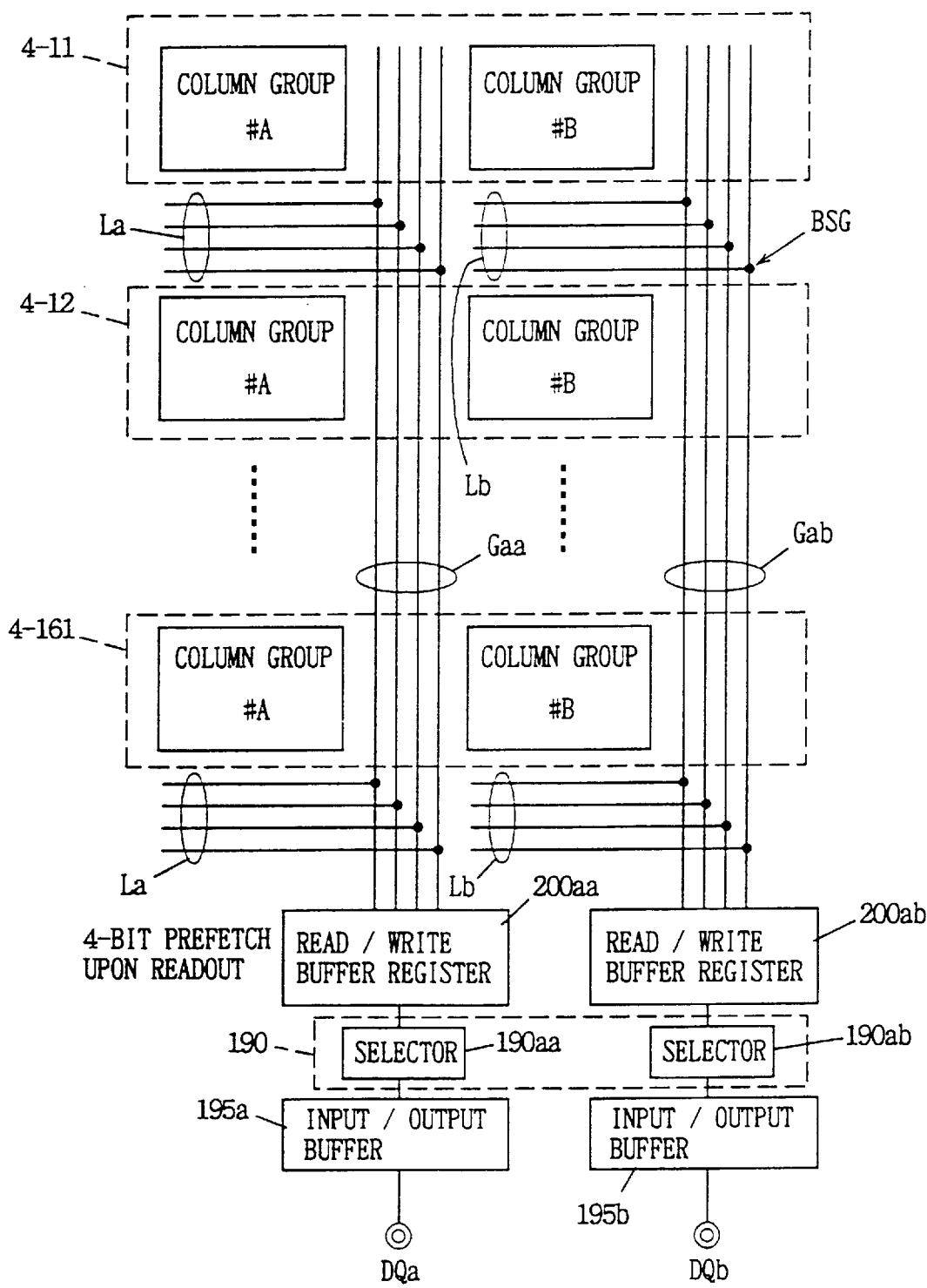
FIG. 15 is a diagram showing an arrangement of buses according to a first modification of the third embodiment of the present invention.

FIG. 15 shows another arrangement of the local IO bus. In FIG. 15, an arrangement of the bus in one bank (bank #1) of one memory mat is shown. Referring to FIG. 15, sub arrays 4-11 to 4-161 are each divided into two column groups #A and #B (see FIGS. 12 and 13). A local IO bus La with a 4-bit width is disposed for column group #A in each of sub arrays 4-11 to 4-161. Similarly, a local IO bus Lb with a 4-bit width is disposed for each column group #B of sub arrays 4-11 to 4-161. All the local IO buses La of column groups #A are connected through block selection gates BSG to a global IO bus Gaa with a 4-bit width disposed in common to respective column groups #A of sub arrays 4-11 to 4-161. A global IO bus Gab with a 4-bit width is disposed in common to respective column groups #B of sub arrays 4-11 to 4-161. Global IO bus Gab with a 4-bit width is connected through selection gates BSG to local IO bus Lb with a 4-bit width provided for each column group #B of sub arrays 4-11 to 4-161. Upon selection, 4 bit memory cells are selected simultaneously in each of column groups #A and #B. When the word line is selected on a bank-by-bank basis, therefore, data of 8-bit memory cells can be input/output because column groups #A and #B (in one sub array) are selected simultaneously.

A read/write buffer register 200aa with a 4 bit width is provided for global IO bus Gaa, while a read/write buffer register 200ab with a 4 bit width is provided for global IO bus Gab. Read/write buffer register 200aa is connected to an input/output buffer 195a through a selector 190aa included in multiplexer 190, and read/write buffer register 200ab is connected to an input/output buffer 195b through a selector 190ab included in multiplexer 190. Input/output buffers 195a and 195b are connected to data input/output terminals DQa and DQb, respectively. Selectors 190aa and 190ab receive the column group selection signal as well as the bank selection signal.

In such a configuration, a word line is selected on a bank-by-bank basis. In this state, read/write buffer registers 200aa and 200ab operate in parallel to each other. Read/write buffer register 200aa can communicate 4-bit data with the selected column group #A in parallel, while read/write buffer register 200ab can communicate 4-bit data with the selected column group #B. When selectors 190aa and 190ab are selected, read/write buffer registers 200aa and 200ab are connected to input/output buffers 195a and 195b. Consequently, data can be input/output to/from data input/output terminals DQa and DQb through input/output buffers 195a and 195b in synchronization with the clock signal. Therefore, in the arrangement shown in FIG. 15, bank #1 can input/output 2 bit data successively four times in synchronization with the clock signal. Since the configuration shown in FIG. 15 is provided for each memory mat, an SDRAM can input/output B-bit data successively four times in synchronization with the clock signal.

Alternative Arrangement of the Bus 2

Figure 16:
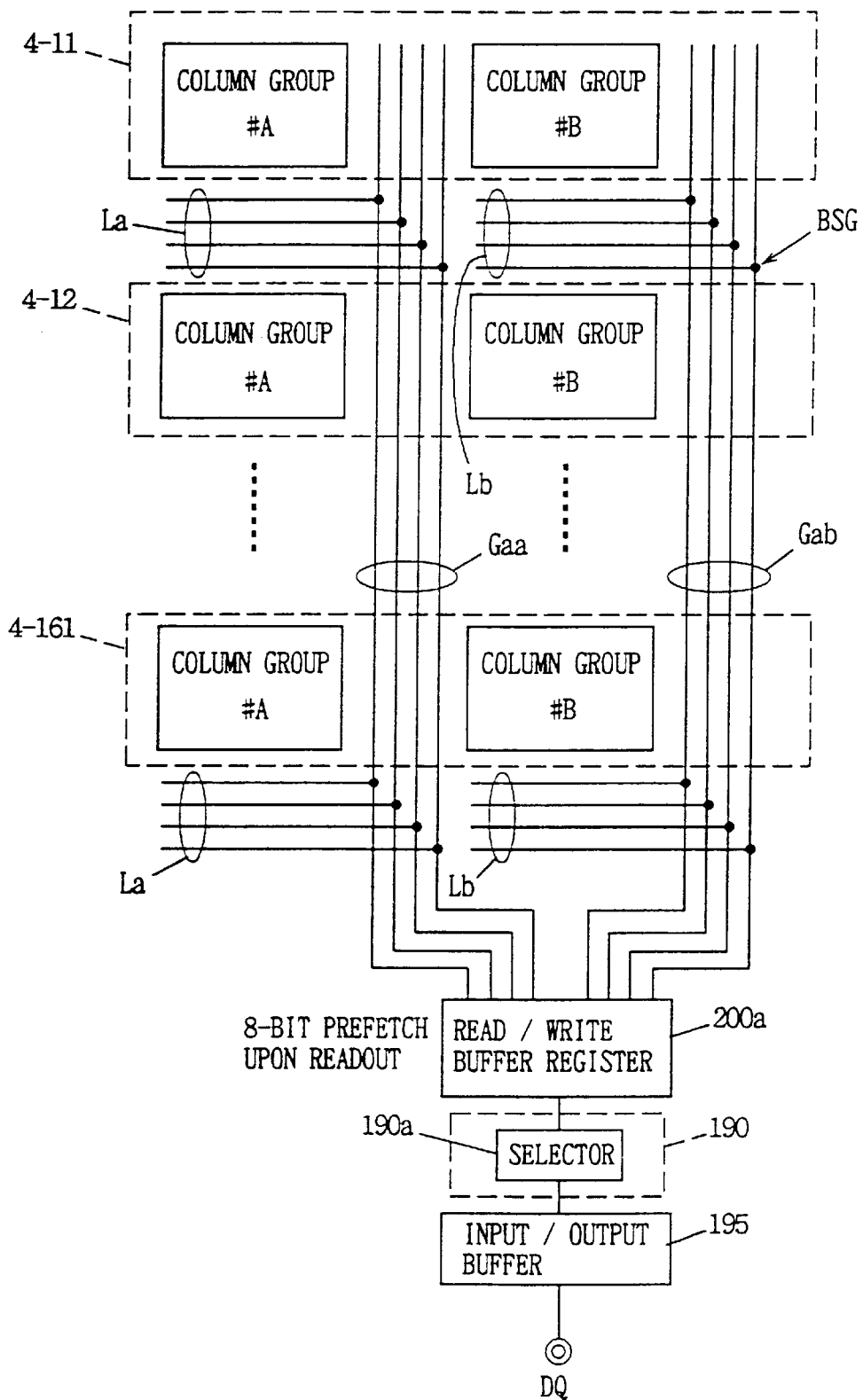
FIG. 16 is a diagram showing another arrangement of buses according to the third embodiment of the present invention.

FIG. 16 shows a configuration of a second alternative bus arrangement in accordance with the third embodiment of the present invention. In contrast to the configuration shown in FIG. 15, global IO buses Gaa and Gab with a 4-bit width are connected to read/write buffer register 200a with a capacity of 8 bits in the configuration shown in FIG. 16. Read/write buffer register 200a is connected to input/output buffer 195 through selector 190a included in multiplexer 190. Input/output buffer 195 communicates data with data input/output terminal DQ. The rest of the configuration is identical to that shown in FIG. 15, and the corresponding portions are labeled with the identical reference numerals.

In the configuration shown in FIG. 16, during operation, one sub array is selected and 4-bit memory cells simultaneously attain the selected state in each of column groups #A and #B. Upon data readout, data on 4-bit local IO buses La and Lb provided corresponding to the selected sub array are transferred to global IO buses Gaa and Gab and to read/write buffer register 200a. Thus, read/write buffer register 200a stores 8-bit data (prefetch of 8-bit data). The 8-bit data stored in read/write buffer register 200a is transmitted to input/output buffer 195 through selector 190a in accordance with an operation control signal (activated in synchronization with clock signal CLK) which is not shown.

In accordance with the operation control signal (R/W) not shown, input/output buffer 195 sequentially outputs data applied from read/write buffer register 200a to data input/output terminal DQ in synchronization with the clock signal. Therefore, the 8-bit data stored in read/write buffer register 200a can be sequentially output in synchronization with the clock signal. Upon output of 8-bit data, another 8-bit data can be read out by activating another bank, so that valid data can be sequentially output from a plurality of banks in synchronization with the clock signal without outputting invalid data (bank interleave).

Upon writing of data, similarly to readout, one sub array is selected and local IO buses La and Lb provided corresponding to column groups #A and #B included in the selected sub array are connected to global IO buses Gaa and Gab. Input/output buffer 195 receives write data from data input/output terminal DQ in synchronization with the clock signal. The data applied to input/output buffer 195 is sequentially stored in read/write buffer register 200a through selector 190a. The 8-bit data stored in read/write buffer register 200a is transmitted through the corresponding bus lines of global IO buses Gaa and Gab to local IO buses La and Lb provided corresponding to column groups #A and #B included in the selected sub array. As a result, data can be stored in 8-bit memory cells in the selected sub array from the corresponding local IO buses La and Lb. In transferring data from read/write buffer register 200a to the selected memory cell, 8-bit data can be transferred in parallel or data can be transferred sequentially 2 bits at a time. The transfer sequence can be chosen as desired.

With the bus arrangement shown in FIG. 16, 4-bit data can be sequentially read out eight times in synchronization with the clock signal because one data input/output terminal DQ is provided for one memory mat. By selecting another bank during sequential input/output of the 4-bit data, desired data can be input/output sequentially with no wait, thereby allowing communication of data with a CPU (not shown) in a burst mode.

The configuration for selecting 4-bit memory cells simultaneously in one column group can be implemented by employing, for example, the configuration where four column selection switches are rendered conductive simultaneously by the column selection signal from the sub column decoder (transmission gates and 8 and 9 in four columns shown in FIG. 11 are rendered conductive simultaneously: this configuration is used for simultaneously selecting adjacent 4-bit memory cells in a standard DRAM).

While the local IO bus and the global IO bus are each formed by a complementary signal line pair in the embodiments described above, such 1-bit bus can be formed by one signal line.

Data input/output terminal DQ can include separately a data input terminal D and a data output terminal Q.

although a dynamic random access memory having a refresh cycle is shown as a synchronous semiconductor memory device, the similar effects of the embodiments above can be obtained by, for example, a static random access memory as long as the device is a semiconductor memory device having a bank configuration and operating in synchronization with the clock signal.

An alternative configuration is also possible in which a register is not provided at the data input/output portion and data is communicated between the column group and the data input/output terminal in a pipeline manner.

As described above, in accordance with the present invention, one memory array is divided into a plurality of banks and therefore one memory array corresponds to a data input/output terminal uniquely so that one data input/output terminal is not connected to interconnection lines from a plurality of memory arrays, thereby reducing interconnection capacitance of the input/output terminal and allowing data transfer at a high speed and simple layout of the interconnections.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with a clock signal applied repetitively regardless of whether an access is made or not, comprising:

at least one data terminal for at least one of input and output of an external data of at least 1 bit; and at least one memory array provided corresponding to said at least one data terminal, said memory array including a plurality of memory cells arranged in a matrix of rows and columns;

said memory array being divided into a plurality of banks arranged adjacent to each other, aligned with respect to as row of said memory cells, and each bank being driven into an array activated state or an array inactivated state by a controller responsive to a bank designation signal, regardless of whether other banks each are in the activated state or in the inactivated state, a bank in said array activated state having a row of memory cells in said bank driven and held in a selected state.

2. The synchronous semiconductor memory device according to claim 1, wherein said external data of at least 1 bit is a multi-bit data, and said at least one data terminal includes a plurality of data terminals provided corresponding to each bit of said multi-bit data; and said at least one memory array includes a plurality of memory arrays provided corresponding to each of said plurality of data terminals and each the memory array divided into said plurality of banks, and a selected memory cell in each of said plurality of memory arrays communicates data with a data terminal corresponding to a related memory array including the selected memory cell.

3. The synchronous semiconductor memory device according to claim 1, further comprising bank selection means for activating a designated bank in accordance with a bank designation signal applied in synchronization with said clock signal, wherein said bank selection means includes means for driving said plurality of banks to an active state independently from each other so that, while one bank attains an active state, another bank can attain an active state in accordance with a bank designation signal applied separately.

4. The synchronous semiconductor memory device according to claim 1, wherein each bank of each of said memory arrays is divided into a plurality of segment blocks in a direction along which a column of said memory cells extends, said synchronous semiconductor memory device further comprising:

a plurality of local IO buses arranged corresponding to each of said segment blocks and separately from each other for communicating data with selected memory cells of corresponding segment blocks;

a plurality of global IO buses arranged corresponding to each bank and in common to the plurality of local IO buses of the corresponding banks, each for communicating data with a local IO bus for a segment block including the selected memory cell; and input/output means provided for each of said plurality of global IO buses and responsive to the bank designation signal for transferring data between a global IO bus provided corresponding to the designated bank and the corresponding data terminal.

5. The synchronous semiconductor memory device according to claim 1, wherein each of said at least one memory array is divided into array blocks of an integral multiple of the number of said banks in a direction in which the row of said memory cells extends and each said bank includes said integral number of array blocks in the row direction; and each of said at least one memory array includes a plurality of main word lines arranged corresponding to each row of memory cells for transmitting a row selection signal for selecting a row designated by a row address signal, a plurality of sub word lines arranged corresponding to a row of memory cells of each of said array blocks, each connected to the memory cells in a corresponding row of a corresponding array block, sub word lines of different array blocks isolated from each other, and a plurality of sub word line drive means arranged corresponding to each of said sub word lines, and each activated in response to said bank designation signal for driving a corresponding sub word line to a selected state when the row selection signal on a corresponding main word line is activated.

6. The synchronous semiconductor memory device according to claim 4, wherein said local IO buses are provided a plurality for each of said segment blocks.

7. The synchronous semiconductor memory device according to claim 4, wherein said global IO buses are provided a plurality for each of said banks of each the memory array.

8. The synchronous semiconductor memory device according to claim 5, wherein at least one said global IO bus is provided for each of said array blocks.

9. The synchronous semiconductor memory device according to claim 5, wherein said bank designation signal designates all the array blocks included in the bank.

10. The synchronous semiconductor memory device according to claim 5, wherein said bank designation signal designates one of the array blocks included in the bank.

11. The synchronous semiconductor memory device according to claim 5, wherein at least one said local IO bus is provided for each of said array blocks, and said synchronous semiconductor memory device further includes connection means for connecting a local IO bus of a designated array block to a corresponding global IO bus in accordance with an array block designation signal.

12. The synchronous semiconductor memory device according to claim 4, further comprising a data register provided corresponding to each of said at least one data terminal and having a capacity for storing a predetermined number of data bits for communicating data with the corresponding data terminal in synchronization with said clock signal; wherein said predetermined number of said global IO buses are provided for each bank in each of said at least one memory array.

13. The synchronous semiconductor memory device according to claim 4, further comprising a plurality of sense amplifiers arranged for each column of the memory cells and alinedly in a line in parallel to the corresponding local IO bus in each the segment block of said at least one memory array for sensing and amplifying data of a selected memory cell on the corresponding column.

14. The synchronous semiconductor memory device according to claim 12, wherein said data register is provided one for each the global SO bus.

15. The synchronous semiconductor memory device according to claim 14, further comprising multiplexer means responsive to the bank designation signal for selectively coupling the data register for the designated bank of the data registers to the data terminal.

* * * * *